United States Patent
Sawadaishi

(10) Patent No.: US 9,380,230 B2
(45) Date of Patent: Jun. 28, 2016

(54) IMAGE CAPTURE DEVICE, ANOMALOUS OBLIQUE INCIDENT LIGHT DETECTION METHOD, AND RECORDING MEDIUM

(71) Applicant: FUJIFILM Corporation, Tokyo (JP)

(72) Inventor: Arito Sawadaishi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/703,343

(22) Filed: May 4, 2015

(65) Prior Publication Data

US 2015/0237273 A1 Aug. 20, 2015

Related U.S. Application Data

(63) Continuation of application No. PCT/JP2013/080410, filed on Nov. 11, 2013.

(30) Foreign Application Priority Data

Dec. 5, 2012 (JP) ................................ 2012-266473

(51) Int. Cl.
*H04N 5/357* (2011.01)
*H01L 27/146* (2006.01)
*H04N 9/64* (2006.01)
*H04N 9/07* (2006.01)
*H04N 5/359* (2011.01)

(52) U.S. Cl.
CPC ........ *H04N 5/3572* (2013.01); *H01L 27/14645* (2013.01); *H04N 5/359* (2013.01); *H04N 9/07* (2013.01); *H04N 9/646* (2013.01)

(58) Field of Classification Search
None
See application file for complete search history.

(56) References Cited

U.S. PATENT DOCUMENTS

| 5,889,554 | A | 3/1999 | Mutze | |
| 7,760,256 | B2* | 7/2010 | Kanamori | H04N 9/045 348/222.1 |
| 7,812,382 | B2* | 10/2010 | Iida | H01L 27/14603 257/292 |
| 8,130,293 | B2* | 3/2012 | Kanamori | H04N 9/045 348/222.1 |

(Continued)

FOREIGN PATENT DOCUMENTS

| EP | 1 793 620 A1 | 6/2007 |
| JP | 2-210996 A | 8/1990 |

(Continued)

OTHER PUBLICATIONS

Extended European Search Report, issued in EP11859479.5, dated Aug. 4, 2014.

(Continued)

*Primary Examiner* — Michael Osinski
(74) *Attorney, Agent, or Firm* — Birch, Stewart, Kolasch & Birch, LLP

(57) ABSTRACT

In an aspect of the invention, plural pixels constituting a color image pickup device include a first pair of RB pixels and a second pair of RB pixels both constituted by a red pixel R having a red color filter and a blue pixel B having a blue color filter in a horizontal direction A and vertical direction B, the red pixel and the blue pixel being adjacent to each other. A position of the red pixel R and a position of the blue pixel B are opposite to each other between the first pair of RB pixels and the second pair of RB pixels. Pixel data of the blue pixel B of the first pair of RB pixels is compared with pixel data of the blue pixel of the second pair of RB pixels to detect whether or not anomalous oblique incident light is incident on the color image pickup device.

16 Claims, 14 Drawing Sheets

(56) References Cited

U.S. PATENT DOCUMENTS

| | | | | |
|---|---|---|---|---|
| 8,564,700 | B2* | 10/2013 | Kanamori | H01L 27/14621 348/273 |
| 8,654,220 | B2* | 2/2014 | Honda | H04N 9/045 348/246 |
| 8,723,991 | B2* | 5/2014 | Kawamura | H04N 5/23212 348/266 |
| 8,742,309 | B2* | 6/2014 | Agranov | G01S 3/782 250/208.1 |
| 8,878,970 | B2* | 11/2014 | Tanaka | H04N 9/045 348/222.1 |
| 8,890,981 | B2* | 11/2014 | Kasai | H04N 9/646 348/231.99 |
| 9,160,990 | B2* | 10/2015 | Kawai | H04N 5/23212 |
| 9,172,925 | B2* | 10/2015 | Sugawara | G02B 7/34 |
| 9,184,196 | B2* | 11/2015 | Tanaka | H04N 9/045 |
| 9,204,020 | B2* | 12/2015 | Kawai | H04N 9/07 |
| 9,264,636 | B2* | 2/2016 | Sugawara | H04N 5/3572 |
| 2005/0094896 | A1 | 5/2005 | Masumura et al. | |
| 2006/0181615 | A1 | 8/2006 | Mihara et al. | |
| 2009/0200451 | A1 | 8/2009 | Conners | |
| 2010/0134660 | A1 | 6/2010 | Yamauchi | |
| 2011/0069210 | A1 | 3/2011 | Ogura et al. | |
| 2011/0076001 | A1* | 3/2011 | Iwasaki | G03B 7/099 396/114 |
| 2011/0181762 | A1* | 7/2011 | Otuka | G06T 3/4015 348/273 |
| 2012/0105688 | A1 | 5/2012 | Kita | |
| 2013/0201388 | A1* | 8/2013 | Hsiao | H04N 5/3572 348/360 |
| 2013/0286261 | A1* | 10/2013 | Tanaka | H04N 5/3728 348/280 |
| 2013/0329117 | A1* | 12/2013 | Kimura | H04N 5/2254 348/344 |
| 2014/0267839 | A1* | 9/2014 | Nishimaki | H04N 5/367 348/246 |
| 2014/0313368 | A1* | 10/2014 | Tanaka | H04N 9/045 348/223.1 |
| 2014/0347533 | A1* | 11/2014 | Toyoda | H04N 9/045 348/294 |
| 2015/0009367 | A1* | 1/2015 | Kobayashi | G02B 7/34 348/240.3 |
| 2015/0015749 | A1* | 1/2015 | Ito | H01L 27/14629 348/273 |
| 2015/0042858 | A1* | 2/2015 | Kokubun | H01L 27/14625 348/302 |
| 2015/0062386 | A1* | 3/2015 | Sugawara | G02B 7/34 348/241 |
| 2015/0076643 | A1* | 3/2015 | Kikuchi | H01L 27/14621 257/432 |
| 2015/0077597 | A1* | 3/2015 | Furuta | H04N 5/359 348/242 |
| 2015/0090909 | A1* | 4/2015 | Shih | G01J 1/0266 250/578.1 |
| 2015/0103216 | A1* | 4/2015 | Kurahashi | H04N 5/217 348/280 |
| 2015/0156405 | A1* | 6/2015 | Izawa | G02B 7/34 348/246 |
| 2015/0172615 | A1* | 6/2015 | Tanaka | H04N 9/045 348/242 |
| 2015/0187843 | A1* | 7/2015 | Hatano | H01L 27/1464 257/40 |
| 2015/0192758 | A1* | 7/2015 | Yamagata | G02B 5/3025 348/360 |
| 2015/0244926 | A1* | 8/2015 | Inoue | G02B 7/34 348/350 |
| 2015/0244955 | A1* | 8/2015 | Kurahashi | H04N 9/07 348/300 |
| 2015/0244957 | A1* | 8/2015 | Kim | H04N 5/3696 348/302 |
| 2015/0271461 | A1* | 9/2015 | Hayashi | H04N 9/07 348/223.1 |
| 2015/0288901 | A1* | 10/2015 | Tanaka | H01L 27/14605 250/208.1 |
| 2015/0326838 | A1* | 11/2015 | Kawai | H04N 9/045 348/280 |
| 2016/0035770 | A1* | 2/2016 | Ahn | H01L 27/1463 257/432 |

FOREIGN PATENT DOCUMENTS

| | | |
|---|---|---|
| JP | 2001-145117 A | 5/2001 |
| JP | 2005-136852 A | 5/2005 |
| JP | 2010-130583 A | 6/2010 |
| JP | 2011-66801 A | 3/2011 |
| JP | 2012-9919 A | 1/2012 |
| JP | 2012-95061 A | 5/2012 |

OTHER PUBLICATIONS

Extended European Search Report, issued in EP11859950.5, dated Oct. 28, 2014.
Extended European Search Report, issued in EP12804973.1, dated Jan. 27, 2015.
Hirakawa et al., "Spatio-Spectral Color Filter Array Design for Optimal Image Recovery", IEEE Transactions on Image Processing, Oct. 1, 2008, vol. 17, No. 10, pp. 1876-1890, p. 1881, left-hand column, paragraph 3; figure 1.
International Search Report, issued in PCT/JP2013/080410, dated Feb. 10, 2014.
Written Opinion of the International Searching Authority, issued in the PCT/JP2013/080410, dated Feb. 10, 2014.

* cited by examiner

IMAGE CAPTURE DEVICE, ANOMALOUS OBLIQUE INCIDENT LIGHT DETECTION METHOD, AND RECORDING MEDIUM

CROSS-REFERENCE TO RELATED APPLICATIONS

This application is a Continuation of PCT International Application No. PCT/JP2013/080410 filed on Nov. 11, 2013, which claims priority under 35 U.S.C. §119(a) to Japanese Patent Application No. 2012-266473 filed on Dec. 5, 2012. Each of the above application(s) is hereby expressly incorporated by reference, in its entirety, into the present application.

BACKGROUND OF THE INVENTION

1. Field of the Invention

The present invention relates to an image capture device, an anomalous oblique incident light detection method, and a recording medium, and particularly, relates to a method for detecting an anomalous oblique incident light such as a flare light.

2. Description of the Related Art

If an intense light is incident on a lens when a subject image is imaged by an image capture device such as a digital camera, a light reflected on a surface of an imaging lens or macro lens is complexly reflected inside the lens or inside the camera such that a light travelling at an unintended angle is sometimes received by an image pickup device. An anomalous oblique incident light incident on the image pickup device at an unintended angle in this way gives rise to a phenomenon such as a so-called ghost, flare or the like to degrade a captured image.

In a case, among others, where the angle of the anomalous oblique incident light is large, at least a part of the anomalous oblique incident light is incident on a photodiode adjacent to a color filter through which the light passes. In the case like this where a color filter through which an anomalous oblique incident light passes and a photodiode actually receiving that light do not completely coincide with each other, this anomalous oblique incident light causes significantly a so-called color mixing phenomenon to lead to color reproducibility degradation of the captured image. Particularly, a long wavelength component (e.g., red light component) gives rise to the color mixing phenomenon between adjacent pixels.

For example, if aperture is F2.8 in image-capturing, it is sufficient that an incident light of about ±10 is incident on each pixel, but there is a concern that an internal reflection in the lens, a reflection between a glass lid and the image pickup device or the like causes an anomalous oblique light to be incident on each pixel at an unexpected angle.

Especially, in recent years, employment of a backside illumination type image pickup device has caused increase of a possible angle of incidence in each pixel of the image pickup device, which has further increased possibility of an anomalous oblique incident light being illuminated on each pixel from an unintended angle.

Since it is characterized that the longer the wavelength component, the deeper the anomalous oblique incident light penetrates into an inside of silicon, the anomalous oblique incident light in a band of longer wavelength has lager effect on surrounding pixels. Therefore, in a case where an RGB color filter is used in the image pickup device, an effect from color mixture caused by the anomalous oblique incident light passing through an R filter is liable to be distinguished in output data of a pixel arranged adjacent to a pixel as the R filter.

For example, PTL 1 (Japanese Patent Application Laid-Open No. 2001-145117) discloses, as a method for reducing such effects from the anomalous oblique incident light, an electronic image pickup device capable of reproducing an image having a color flare reduced. According to this electronic image pickup device, an area is detected which has a pixel of luminance difference exceeding a certain level among the certain number of adjacent pixels (e.g., six pixels) where the color flare is distinguished.

PTL 2 (Japanese Patent Application Laid-Open No. 2005-136852) discloses an image processing apparatus that corrects image components corresponding to a non-image-forming light in image data. According to this image processing apparatus, a flare image corresponding to an unnecessary diffraction light is silhouetted against a background image on the basis of a difference between an average luminance value of an adjacent pixel group and a luminance value of a notice pixel group, the adjacent pixel group corresponding to a diameter of the flare image depending on a diffraction order.

SUMMARY OF THE INVENTION

However, the methods according to PTL 1 and PTL 2 may not necessarily sufficiently reduce the effect from the flare.

The electronic image pickup device in PTL 1 detects an area having a pixel of luminance difference exceeding a certain level as an area where the color flare is distinguished. Therefore, for example, in a captured image of a subject having in nature a luminance difference exceeding a certain level, even if a flare does not occur, the flare occurrence is likely to be erroneously detected to cause erroneous correction.

The image processing apparatus in PTL 2 addresses the flare image due to the unnecessary diffraction light occurring in a diffraction optical element, whose application range is limited to a case where the image processing apparatus is combined with a lens using the diffraction optical element.

Therefore, there has been a demand for a proposition of a new method capable of detecting limitedly the anomalous oblique incident light to be a factor of the flare of the like without limitation on the lens or the like used in imaging and properly correcting the color mixture.

The present invention has been made in consideration of such a circumstance, and has an object to provide a technology that detects the anomalous oblique incident light generating the flare or the like with a good accuracy independently of the lens or the like used in imaging.

A first aspect of the invention relates to an image capture device including an image pickup device having plural pixels arranged in a first direction and a second direction perpendicular to the first direction, each of the plural pixels including a color filter and a photodiode receiving a light having passed through the color filter to output pixel data, and an anomalous oblique incident light detection device that detects whether or not an anomalous oblique incident light is incident on the image pickup device on the basis of the pixel data, in which the plural pixels include a first pixel pair and a second pixel pair which are each constituted by a first-color pixel having a first-color color filter and a second-color pixel having a second-color color filter, the first-color pixel and the second-color pixel being adjacent to each other in at least one of the first direction and the second direction, and have an arrangement in which a position of the first-color pixel and a position of the second-color pixel are opposite to each other, the first-color color filter has a transmission rate higher than the second-color color filter in at least a part of a red light wavelength range, and the anomalous oblique incident light detection device compares the pixel data of the second-color pixel of the first pixel pair with the pixel data of the second-color pixel of the second pixel pair to detect whether or not the anomalous oblique incident light is incident.

According to this aspect, the anomalous oblique incident light (among others, the anomalous oblique incident light including a component in the red light wavelength range) can be detected with a good accuracy on the basis of a difference between the pixel data of the second-color pixel of the first pixel pair and the pixel data of the second-color pixel of the second pixel pair.

The term "anomalous oblique incident light" here refers to an unexpected optic element different from ordinary lights constituting a subject image, that is, the optic element passing through the color filter and the photodiode which are not included in the same pixel. The anomalous oblique incident light may include, for example, the optic element inducing a phenomenon such as a ghost or flare. In general, the ghost is a phenomenon where an optical image having a certain shape to be visually perceived is formed owing to a light (unnecessary light) reaching an image surface after passing through a light path different from a light path of an intended light to be imaged (effective light to be imaged) via reflection on a lens surface or an image pickup device surface. The flare is a phenomenon where if an intense light is incident on the optical system, a part of the incident light is reflected on the lens surface or the image pickup device surface and then reaches the image surface as an unnecessary light to bring about image anomaly with a certain shape being not visually perceived, casing low contrast or bleeding of light in a produced image.

The "first direction" and the "second direction" are not specifically limited and may be directions that are perpendicular (including, substantially perpendicular) to each other. For example, the "horizontal direction" and the "vertical direction" with respect to the subject in image-capturing by the image capture device may be the "first direction" and the "second direction" or directions at an arbitrary angle to these "horizontal direction" and "vertical direction" may be the "first direction" and the "second direction". Therefore, in a case where the plural pixels are arranged with a so-called "honeycomb-type arrangement" in which the plural pixels two-dimensionally arranged in the horizontal direction and the vertical direction are rotated by 45 degrees, directions at an angle of 45 degrees to the "horizontal direction" and the "vertical direction", respectively may be the "first direction" and the "second direction".

"At least a part of a red light wavelength range" refers to all or a part of a red wavelength range. For example, assuming that a light having a wavelength range of "590 nm to 750 nm" (visible light ray) is a red light, the first-color color filter has a transmission rate higher than the second-color color filter in throughout or at least a part of the wavelength range of "590 nm to 750 nm".

It is preferable that the first-color color filter have a light transmission rate equal to or more than 50% in a wavelength range of 600 nm to 650 nm, and the second-color color filter have a light transmission rate less than 50% in a wavelength range of 600 nm to 650 nm. More preferably, the first-color color filter has a light transmission rate equal to or more than 50% in a wavelength range of 630 nm to 650 nm, and the second-color color filter has a light transmission rate less than 50% in a light transmission rate of 630 nm to 650 nm. More preferably, the first-color color filter has a light transmission rate equal to or more than 60% in a wavelength range of 600 nm to 650 nm. More preferably, the first-color color filter has a light transmission rate equal to or more than 70% in a wavelength range of 600 nm to 650 nm. More preferably, the first-color color filter has a light transmission rate equal to or more than 80% in a wavelength range of 600 nm to 650 nm. More preferably, the first-color color filter has a light transmission rate equal to or more than 90% in a wavelength range of 600 nm to 650 nm. More preferably, the second-color color filter has a light transmission rate less than 40% in a wavelength range of 600 nm to 650 nm. More preferably, the second-color color filter has a light transmission rate less than 30% in a wavelength range of 600 nm to 650 nm. More preferably, the second-color color filter has a light transmission rate less than 20% in a wavelength range of 600 nm to 650 nm. More preferably, the second-color color filter has a light transmission rate less than 10% in a wavelength range of 600 nm to 650 nm.

A so-called flare phenomenon in image-capturing often includes the red light having a wavelength range of 600 nm to 650 nm. According to this aspect, the anomalous oblique incident light including a red light component in such a wavelength range can be efficiently detected.

It is preferable that the first-color color filter be any of a red filter, a transparent filter, and a white filter, and the second-color color filter be any of a blue filter and a green filter.

In this case, the anomalous oblique incident light including the component in the red light wavelength range can be efficiently detected.

The red filter mainly transmits a light in the red wavelength range, the blue filter mainly transmits a light in the blue wavelength range, and the green filter mainly transmits a light in the green wavelength range. The transparent filter and the white filter are each a filter transmitting any of a light in the red wavelength range, a light in the blue wavelength range, and a light in the green wavelength range, specifically, the transparent filter has a relatively high light transmission rate (for example, light transmission rate of 70% or more), and the white filter has a light transmission rate lower than the transparent filter.

It is preferable that the anomalous oblique incident light detection device detect whether or not the anomalous oblique incident light is incident, on the basis of whether or not a difference value between the pixel data of the second-color pixel of the first pixel pair and the pixel data of the second-color pixel of the second pixel pair is equal to or more than a threshold.

In this case, if the difference value between the pixel data of the second-color pixel of the first pixel pair and the pixel data of the second-color pixel of the second pixel pair is equal to or more than a threshold, it can be detected that "the anomalous oblique incident light is incident", effectively preventing erroneous detection due to variations (error) or the like in the pixel data inherent in the pixel.

The "threshold" here can be defined adequately depending on properties of the anomalous oblique incident light as a target to be detected.

It is preferable that the anomalous oblique incident light detection device determine an incident direction of the anomalous oblique incident light on the basis of a magnitude relationship between the pixel data of the second-color pixel of the first pixel pair and the pixel data of the second-color pixel of the second pixel pair.

In this case, the incident direction of the anomalous oblique incident light can be easily determined on the basis of a magnitude relationship between the pixel data of the second-color pixel of the first pixel pair and the pixel data of the second-color pixel of the second pixel pair.

It is preferable that the image capture device further include correction device that corrects the pixel data of the pixel having the photodiode on which the anomalous oblique incident light is incident on the basis of a detection result by the anomalous oblique incident light detection device, in which the correction device determines the pixel, of the plural pixels, having the photodiode on which the anomalous oblique incident light is incident, on the basis of the incident direction of the anomalous oblique incident light determined by the anomalous oblique incident light detection device.

In this case, the pixel having the photodiode on which the anomalous oblique incident light is incident is determined on the basis of the incident direction of the anomalous oblique incident light, allowing the pixel data of the determined pixel to be corrected.

It is preferable that the correction device correct the pixel data of the pixel having the photodiode on which the anomalous oblique incident light is incident on the basis of the difference value between the pixel data of the second-color pixel of the first pixel pair and the pixel data of the second-color pixel of the second pixel pair.

In this case, the pixel data of the pixel having the photodiode on which the anomalous oblique incident light is incident is corrected on the basis of the difference value between the pixel data of the second-color pixel of the first pixel pair and the pixel data of the second-color pixel of the second pixel pair, reducing the effect on the image data from the anomalous oblique incident light.

It is preferable that the correction device correct the pixel data of the pixel having the photodiode on which the anomalous oblique incident light is incident, on the basis of the pixel data of a pixel which has a color filter of the same color as the pixel having the photodiode on which the anomalous oblique incident light is incident, and which has the photodiode on which no anomalous oblique incident light is incident.

In this case, the pixel data of the pixel having the photodiode on which the anomalous oblique incident light is incident is corrected using the pixel data of the pixel having the photodiode on which no anomalous oblique incident light is incident, reducing the effect on the image data from the anomalous oblique incident light.

It is preferable that the plural pixels include plural pixel blocks, each of the plural pixel blocks including pixels constituting the first pixel pair and the second pixel pair and pixels adjacent to the pixels constituting the first pixel pair and the second pixel pair, at least a part of the plural pixels is classified into any of the plural pixel blocks, and the correction device corrects the pixel data of the pixel having the photodiode on which the anomalous oblique incident light is incident, on the basis of the pixel data of the second-color pixel of the first pixel pair and the pixel data of the second-color pixel of the second pixel pair, in the pixel block including the first pixel pair and the second pixel pair where it is detected by the anomalous oblique incident light detection device that the anomalous oblique incident light is incident.

In this case, the pixel data of the pixel having the photodiode on which the anomalous oblique incident light is incident can be corrected for each pixel block.

It is preferable that the plural pixels include the plural pixel blocks and plural buffer blocks disposed between the plural pixel blocks, each of the plural pixels is classified into any of the plural pixel blocks and the plural buffer block, and the correction device corrects the pixel data of the pixel, of the pixels included in the buffer block, having the photodiode on which the anomalous oblique incident light is incident, on the basis of a correction amount for the pixel data of the pixel having the photodiode on which the anomalous oblique incident light is incident, of the pixel blocks adjacent to the relevant buffer block.

In this case, the pixel data of the pixel included in the buffer block can be corrected with a good accuracy on the basis of the correction amount for the pixel data in the pixel block adjacent to the buffer block.

It is preferable that the plural pixels include a first pixel pair block and a second pixel pair block, in each of which pair blocks the first pixel pair and the second pixel pair are adjacently arranged with 2 pixels being arranged in the first direction and 2 pixels being arranged in the second direction, a position of the first-color pixel and a position of the second-color pixel are opposite to each other between the first pixel pair block and the second pixel pair block, and the anomalous oblique incident light detection device determines the incident direction of the anomalous oblique incident light on the basis of the pixel data of two pixels included in the first pixel pair block and having the second-color color filter and the pixel data of two pixels included in the second pixel pair block and having the second-color color filter.

In this case, the incident direction of the anomalous oblique incident light can be determined with a good accuracy on the basis of the pixel data from the first pixel pair block and the second pixel pair block where the position of the first-color pixel and the position of the second-color pixel are opposite to each other.

It is preferable that the first pixel pair block include a first pixel to which the first-color pixels are adjacent on one side in the first direction and on one side in the second direction and which has the second-color color filter, and a second pixel to which the first-color pixels are adjacent on the other side in the first direction and on the other side in the second direction and which has the second-color color filter, the second pixel pair block include a third pixel to which the first-color pixels are adjacent on the other side in the first direction and on one side in the second direction and which has the second-color color filter, and a fourth pixel to which the first-color pixels are adjacent on one side in the first direction and on the other side in the second direction and which has the second-color color filter, and the anomalous oblique incident light detection device determine the incident direction of the anomalous oblique incident light on the basis of a magnitude relationship between the pixel data of the first pixel and the pixel data of the second pixel and a magnitude relationship between the pixel data of the third pixel and the pixel data of the fourth pixel.

In this case, the incident direction of the anomalous oblique incident light can be determined with a good accuracy on the basis of the pixel data from the first pixel pair block and the second pixel pair block where the position of the first-color pixel and the position of the second-color pixel are opposite to each other.

It is preferable that the first pixel pair and the second pixel pair be disposed in the first direction or the second direction in each of the plural pixel blocks, the plural pixel blocks include the pixel blocks adjacent to each other in a direction, of the first direction and the second direction, in which the first pixel pair and the second pixel pair included in the plural pixel blocks are disposed, and the correction device correct the pixel data of the pixel having the photodiode on which the anomalous oblique incident light is incident in the pixel block including the first pixel pair and the second pixel pair where it is detected by the anomalous oblique incident light detection device that the anomalous oblique incident light is incident, on the basis of the pixel data of the second-color pixel of the first pixel pair and the pixel data of the second-color pixel of the second pixel pair in the relevant pixel block, and the pixel data of the second-color pixel of the first pixel pair and the pixel data of the second-color pixel of the second pixel pair in the pixel block adjacent to the relevant pixel block.

In this case, besides the pixel data of the second-color pixel of the first pixel pair and the pixel data of the second-color pixel of the second pixel pair in the pixel block as a target to be corrected, the pixel data of the second-color pixel of the first pixel pair and the pixel data of the second-color pixel of the second pixel pair in the pixel block adjacent to this pixel block as a target to be corrected are taken into account to make it possible to correct with a good accuracy the pixel data in the pixel block as a target to be corrected.

It is preferable that the plural pixels include plural basic arrangement pixel groups arrayed in the first direction and the second direction, each group having a color filter arrangement pattern, and each of the plural basic arrangement pixel groups includes the first pixel pair and the second pixel pair.

In this case, the first pixel pair and the second pixel pair are arranged depending on the number of the basic arrangement pixel groups, allowing the first pixel pair and the second pixel pair to be arranged uniformly across the plural pixels.

An another aspect of the invention relates to an anomalous oblique incident light detection method for detecting whether or not an anomalous oblique incident light is incident on an image pickup device, on the basis of pixel data output from the image pickup device, the image pickup device having plural pixels arranged in a first direction and a second direction perpendicular to the first direction, each of the plural pixels including a color filter and a photodiode receiving a light having passed through the color filter to output the pixel data, the plural pixels including a first pixel pair and a second pixel pair which are each constituted by a first-color pixel having a first-color color filter and a second-color pixel having a second-color color filter, the first-color pixel and the second-color pixel being adjacent to each other in at least one of the first direction and the second direction, and have an arrangement in which a position of the first-color pixel and a position of the second-color pixel are opposite to each other, and the first-color color filter having a transmission rate higher than the second-color color filter in at least a part of a red light wavelength range, the method including a step of acquiring the pixel data of the second-color pixel of the first pixel pair and the pixel data of the second-color pixel of the second pixel pair, and a step of comparing the acquired pixel data of the second-color pixel of the first pixel pair with the acquired pixel data of the second-color pixel of the second pixel pair to detect whether or not the anomalous oblique incident light is incident.

An another aspect of the invention relates to a program causing a computer to execute a procedure for detecting whether or not an anomalous oblique incident light is incident on an image pickup device, on the basis of pixel data output from the image pickup device, the image pickup device having plural pixels arranged in a first direction and a second direction perpendicular to the first direction, each of the plural pixels including a color filter and a photodiode receiving a light having passed through the color filter to output the pixel data, the plural pixels including a first pixel pair and a second pixel pair which are each constituted by a first-color pixel having a first-color color filter and a second-color pixel having a second-color color filter, the first-color pixel and the second-color pixel being adjacent to each other in at least one of the first direction and the second direction, and have an arrangement in which a position of the first-color pixel and a position of the second-color pixel are opposite to each other, and the first-color color filter having a transmission rate higher than the second-color color filter in at least a part of a red light wavelength range, the program causing the computer to execute a procedure of acquiring the pixel data of the second-color pixel of the first pixel pair and the pixel data of the second-color pixel of the second pixel pair, and a procedure of comparing the acquired pixel data of the second-color pixel of the first pixel pair with the acquired pixel data of the second-color pixel of the second pixel pair to detect whether or not the anomalous oblique incident light is incident.

An another aspect of the invention relates to a recording medium having a computer-readable code of a program recorded therein, the program causing a computer to execute a procedure for detecting whether or not an anomalous oblique incident light is incident on an image pickup device on the basis of pixel data output from the image pickup device, the image pickup device having plural pixels arranged in a first direction and a second direction perpendicular to the first direction, each of the plural pixels including a color filter and a photodiode receiving a light having passed through the color filter to output the pixel data, the plural pixels including a first pixel pair and a second pixel pair which are each constituted by a first-color pixel having a first-color color filter and a second-color pixel having a second-color color filter, the first-color pixel and the second-color pixel being adjacent to each other in at least one of the first direction and the second direction, and have an arrangement in which a position of the first-color pixel and a position of the second-color pixel are opposite to each other, and the first-color color filter having a transmission rate higher than the second-color color filter in at least a part of a red light wavelength range, the procedure including a procedure of acquiring the pixel data of the second-color pixel of the first pixel pair and the pixel data of the second-color pixel of the second pixel pair, and a procedure of comparing the acquired pixel data of the second-color pixel of the first pixel pair with the acquired pixel data of the second-color pixel of the second pixel pair to detect whether or not the anomalous oblique incident light is incident.

According to the present invention, the anomalous oblique incident light generating the flare or the like (among others, the anomalous oblique incident light including a component in the red light wavelength range) can be detected with a good accuracy on the basis of a difference between the pixel data of the second-color pixel of the first pixel pair and the pixel data of the second-color pixel of the second pixel pair, independent of the lens or the like used in imaging.

DETAILED DESCRIPTION OF THE EMBODIMENTS

A description is given of embodiments of the present invention with reference to the drawings. First, described is a basic configuration of a digital camera (image capture device) that is an exemplary application of the invention, and subsequently, described is a method for detecting an anomalous oblique incident light (flare light or the like) by use of pixel data of R (red) pixel B (blue) pixel which are adjacent to each other.

Figure 1:
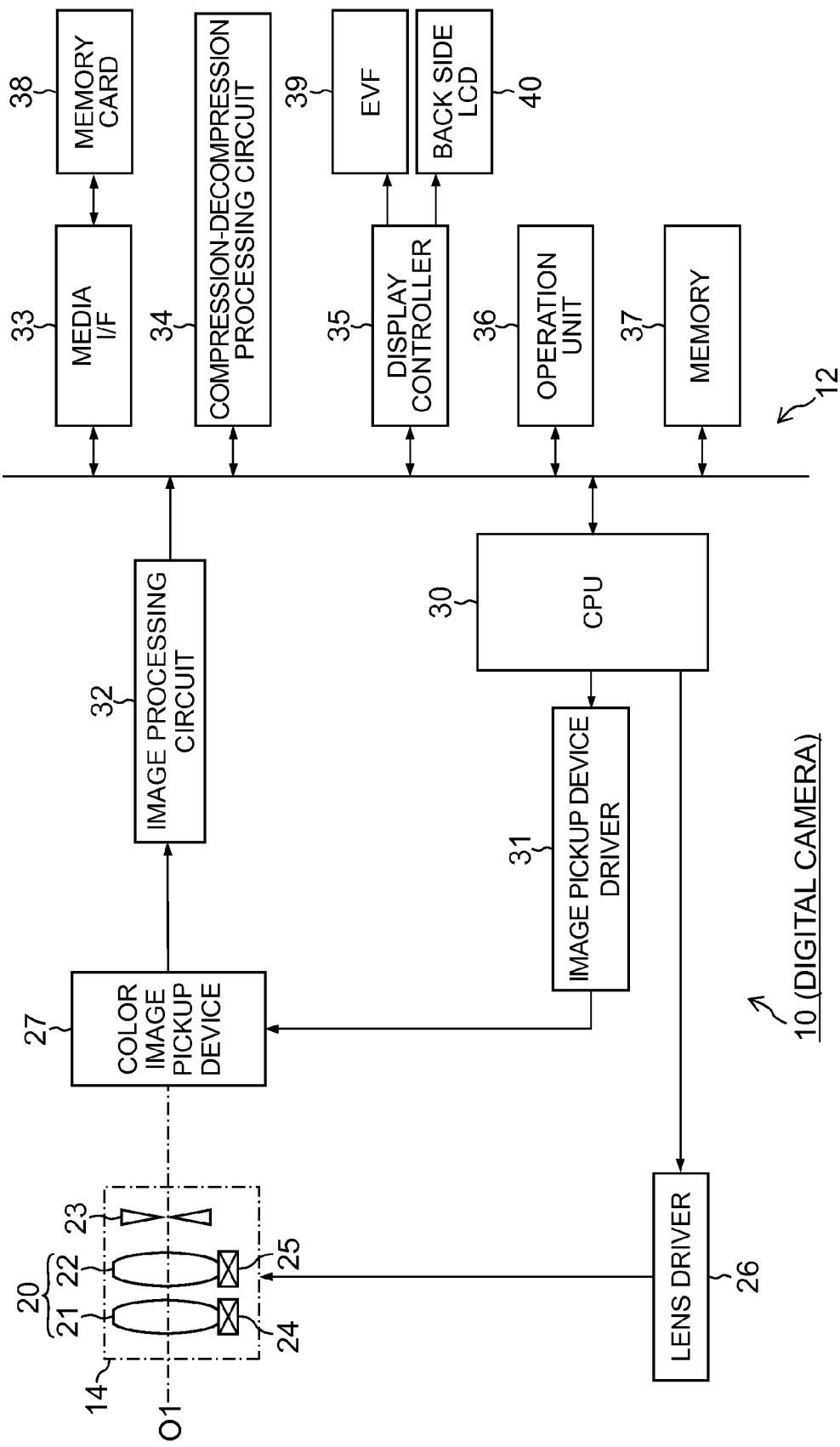
FIG. 1 is a block diagram showing an exemplary configuration of a digital camera.

FIG. 1 is a block diagram showing an exemplary configuration of a digital camera 10. This example describes an example in which units in the configuration shown in FIG. 1 other than a lens unit 14 are provided in a camera main body 12, but the units may be provided in the lens unit 14 as needed.

The digital camera (image capture device) 10 includes the camera main body 12 and the lens unit 14 replaceably attached on a front side of the camera main body 12.

The lens unit 14 includes an imaging optical system 20 having a zoom lens 21 and focus lens 22, a mechanical shutter 23, and the like. The zoom lens 21 and the focus lens 22 are driven by a zoom mechanism 24 and a focus mechanism 25, respectively, and moved back and forth along an optical axis O1 of the imaging optical system 20. The zoom mechanism 24 and the focus mechanism 25 are constituted by a gear, motor and the like.

The mechanical shutter 23 has a movable unit (illustration thereof omitted) moving between a closing position where a subject light incident on a color image pickup device 27 is blocked and an opening position where the subject light incident is permitted. The movable unit is moved to the opening position/closing position to allow a path of light from the imaging optical system 20 to the color image pickup device 27 to be opened/closed. The mechanical shutter 23 includes a diaphragm controlling a light amount of the subject light incident on the color image pickup device 27. The mechanical shutter 23, zoom mechanism 24, and focus mechanism 25 undergo a drive control by a CPU 30 via lens driver 26.

The CPU 30 disposed in the camera main body 12 sequentially executes various programs and data read out from a memory 37 on the basis of a control signal from an operation unit 36 to overall control various sections of the digital camera 10. A RAM area of the memory 37 serves as a transient storage for a work memory where the CPU 30 performs processing of various pieces of data.

The operation unit 36 includes a button, key, touch panel and those similar thereto which are operated by a user. For example, the operation unit 36 may include a power switch, shutter button, focus mode selector lever, focus ring, mode selector button, cross-shaped selection key, execution key, back button and the like which are disposed in the camera main body 12 and operated by the user.

The color image pickup device 27 converts a subject light having passed through the imaging optical system 20 and the mechanical shutter 23 into an electrical output signal to output. This color image pickup device 27 has a single-plate pixel arrangement in which a large number of pixels are arrayed in a horizontal direction (first direction) and a vertical direction (second direction) perpendicular to the horizontal direction and to which arbitrary methods using a CCD (Charge Coupled Device), a CMOS (Complementary Metal Oxide Semiconductor) or the like can be applied.

The pixels constituting the color image pickup device 27, which is specifically described later, each includes a microlens for improving a light collection rate, a color filter of RGB or the like, and a photodiode (photoelectric conversion device) for receiving a light passing through the microlens and the color filter to output pixel data.

The image pickup device driver 31 controls the color image pickup device 27 to be driven under control by the CPU 30 such that a captured image signal (image data) is output from the pixel in the color image pickup device 27 to the image processing circuit 32.

The image processing circuit 32 subjects the captured image signal (image data) output from the color image pickup device 27 to various image processing such as gradation conversion, white balance correction, y correction processing and the like to generate captured image data. Particularly, the image processing circuit 32 in this example, which is specifically described later, performs detection and color mixture correction of an anomalous oblique light containing a red wavelength range component such as a flare light anomalous.

A compression-decompression processing circuit 34 subjects the captured image data stored in a VRAM area of the memory 37 to compression processing when the shutter button is operated to be pressed down by the user. The compression-decompression processing circuit 34 subjects the compressed image data obtained via a media interface 33 from a memory card 38 to decompression processing. The media interface 33 records and reads out the captured image data in and from the memory card 38.

A display controller 35, in an imaging mode, performs control to display a through image (live view image) generated by the image processing circuit 32 on at least one of an EVF (electronic viewfinder) 39 and a back side LCD (back side liquid crystal) 40. The display controller 35, in an image reproduction mode, outputs the captured image data decompressed by the compression-decompression processing circuit 34 to the back side LCD 40 (and/or the EVF 39).

The digital camera 10 (camera main body 12) may be provided with other processing circuits than the above and the like, for example, an AF detection circuit for auto focus and an AE detection circuit for automatic exposure adjustment. The CPU 30 performs AF processing by driving the focus lens 22 via the lens driver 26 and focus mechanism 25 on the basis of a detection result by the AF detection circuit, and performs AE processing by driving the mechanical shutter 23 via the lens driver 26 on the basis of a detection result by the AE detection circuit.

Next, a description is given of detection and color mixture correction of the anomalous oblique light containing the red wavelength range component such as the flare light. Note, "the anomalous oblique light containing the red wavelength range component" is also referred to as "red anomalous oblique incident light".

Figure 2A:
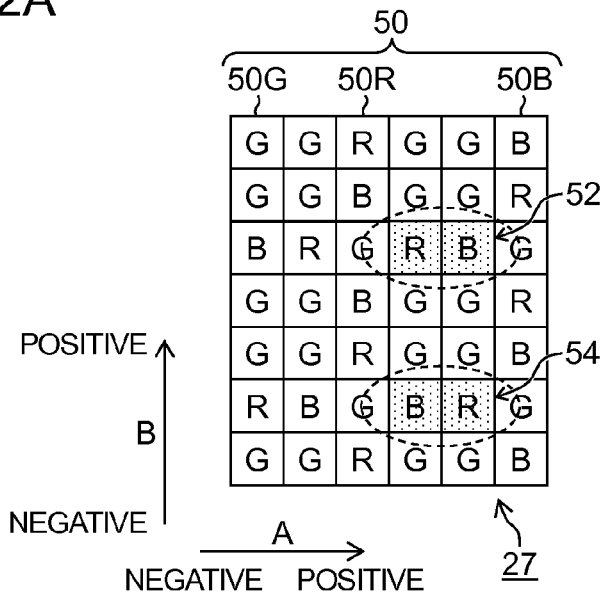
FIG. 2A is an illustration showing an example of an image pickup surface of a color image pickup device, a part of the image pickup surface being enlarged.
Figure 2B:
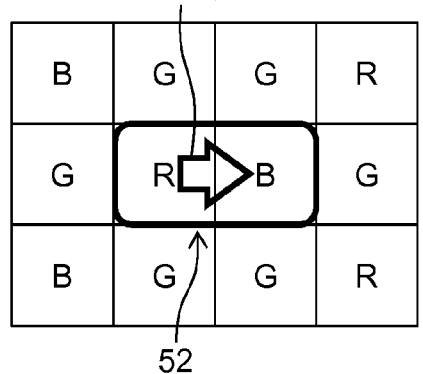
FIG. 2B is another illustration showing an example of an image pickup surface of a color image pickup device with a first pair of RB pixels and pixels surrounding the pair which are shown in FIG. 2A being enlarged and shown.
Figure 2C:
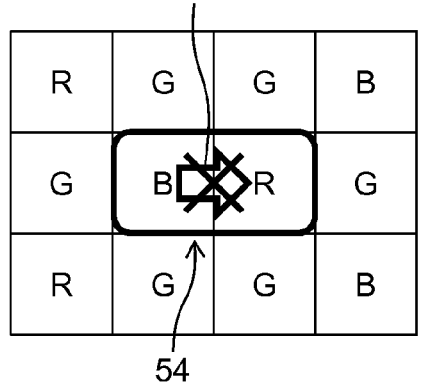
FIG. 2C is another illustration showing an example of an image pickup surface of a color image pickup device with a second pair of RB pixels and pixels surrounding the pair which are shown in FIG. 2A being enlarged and shown.

FIGS. 2A to 2C are each an illustration showing an example of an image pickup surface of the color image pickup device 27, FIG. 2A is an illustration with a part of the image pickup device surface being enlarged, FIG. 2B is an illustration with a first pair 52 of RB pixels and pixels surrounding the pair which are shown in FIG. 2A being enlarged and shown, and FIG. 2C is an illustration with a second pair 54 of RB pixels and pixels surrounding the pair shown in FIG. 2A being enlarged and shown.

The color image pickup device 27 includes a plurality of R (red) pixels 50R each having a red color filter, a plurality of G (green) pixels 50G each having a green color filter, and a plurality of B (blue) pixels 50B each having a blue color filter, and these plural pixels 50 are regularly arranged to configure an image pickup surface. The color filter of the R pixel 50R has a transmission rate higher than the color filters of the G pixel 50G and B pixel 50B in a red light wavelength range (throughout or at least a part of the range), the color filter of the G pixel 50G has a transmission rate higher than the color filters of the R pixel 50R and B pixel 50B in a green light wavelength range (throughout or at least a part of the range), and the color filter of the B pixel 50B has a transmission rate higher than the color filters of the R pixel 50R and G pixel 50G in a blue light wavelength range (throughout or at least a part of the range).

For example, the red color filter has the light transmission rate equal to or more than 50% in at least a wavelength range of 600 nm to 650 nm, but the green color filter and the blue color filter have the light transmission rate less than 50% in a wavelength range of 600 nm to 650 nm.

The plural pixels 50 in this embodiment include a pair of "R pixel (first-color pixel) and B pixel (second-color pixel)" arranged adjacent to each other in this order and a pair of "B pixel and R pixel" arranged adjacent to each other in this order both in the horizontal direction (refer to an arrow A in FIG. 2A) and the vertical direction (refer to an arrow B in FIG. 2A). FIG. 2A shows, with hatching, the first pair of RB pixels (first pixel pair) 52 of "R pixel and B pixel" arranged adjacent to each other in this order in a horizontal direction A and the second pair of RB pixels (second pixel pair) 54 of "B pixel and R pixel" arranged adjacent to each other in this order in the horizontal direction A.

For example, when the red anomalous oblique incident light is incident on the color image pickup device 27 in a direction of the arrow A (positive direction of the horizontal direction) in FIG. 2A, a red anomalous oblique incident light 58 passing through the color filter of the R pixel is received by a photodiode of the B pixel between the first pair 52 of RB pixels to give rise to a color mixing phenomenon occurs (see FIG. 2B). On the other hand, the red anomalous oblique incident light 58 does not pass through the color filter of the B pixel and not received by a photodiode of the R pixel between the second pair 54 of RB pixels, not giving rise the color mixing phenomenon (see FIG. 2C).

Figure 3A:
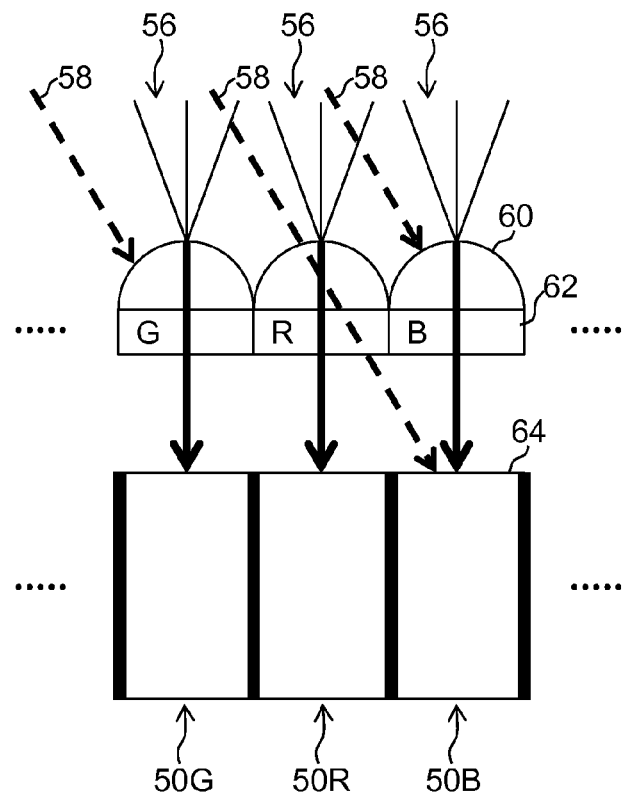
FIG. 3A is a cross-sectional view illustrating a mechanism of a color mixing phenomenon and shows an exemplary adjacent arrangement of G pixel, R pixel and B pixel.
Figure 3B:
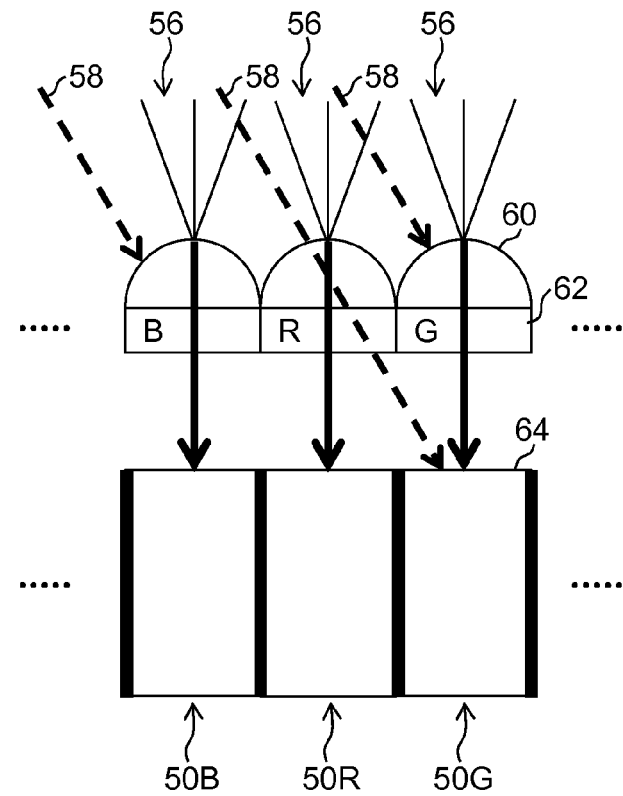
FIG. 3B is a cross-sectional view illustrating a mechanism of a color mixing phenomenon and shows an exemplary adjacent arrangement of B pixel, R pixel and G pixel.

FIGS. 3A and 3B are cross-sectional views each illustrating a mechanism of the color mixing phenomenon, and FIG. 3A shows an exemplary adjacent arrangement of G pixel, R pixel, and B pixel, and FIG. 3B shows an exemplary adjacent arrangement of B pixel, R pixel and G pixel.

In each of the G pixel 50G, the R pixel 50R and the B pixel 50B, a microlens 60, a color filter 62, and a photodiode 64 are disposed in order in relation to a travelling direction of the subject light. An ordinary light 56 constituting the subject light is collected by the microlens 60 and passes through the color filter 62 to be incident on the photodiode 64, where the color filter 62 through which the ordinary light 56 passes corresponds to the photodiode 64 receiving the light 56.

On the other hand, the red anomalous oblique incident light 58 enters each pixel at an angle different from the ordinary light 56 and passes through the color filter of the R pixel 50R 62 to be incident on the photodiode 64 of the adjacent pixel (the B pixel 50B in the example shown in FIG. 3A, and the G pixel 50G in the example shown in FIG. 3B). Therefore, the color filter 62 through which the red anomalous oblique incident light 58 passes does not correspond to the photodiode 64 receiving the light 58, and thus, the photodiode 64 receiving the red anomalous oblique incident light 58 outputs the pixel data corresponding to an amount of the received light from not only the ordinary light 56 but also the red anomalous oblique incident light 58. Accordingly, the output pixel data from the photodiode which has received the red anomalous oblique incident light 58 is increased more than the output pixel data from the photodiode not receiving the red anomalous oblique incident light 58. For example, if the ordinary lights 56 in FIGS. 3A and 3B have the same intensity, an output pixel data value of the B pixel 50B in FIG. 3A is larger than an output pixel data value of the B pixel 50B in FIG. 3B, and an output pixel data value of the G pixel 50G in FIG. 3B is larger than an output pixel data value of the G pixel 50G in FIG. 3A.

The red anomalous oblique incident light 58 incident on the G pixel 50G and the B pixel 50B is not received or is hard to be received by the photodiode 64 of the adjacent pixels, differently from the red anomalous oblique incident light 58 incident on the R pixel 50R. This is because the red wavelength range component contained in the red anomalous oblique incident light 58 does not pass through (hardly passes through) the color filters 62 of the G pixel 50G and B pixel 50B 62. Also, this is because the red light component is a long wavelength component which likely reaches deeply in the photodiode (for example, silicon) to give rise to the color mixing phenomenon, but other wavelength components (blue light component, and green light component) which are on the wavelength side shorter than the red light component do not enter the photodiode more deeply than the red light component, hardly giving rise to the color mixing phenomenon.

Figure 4:
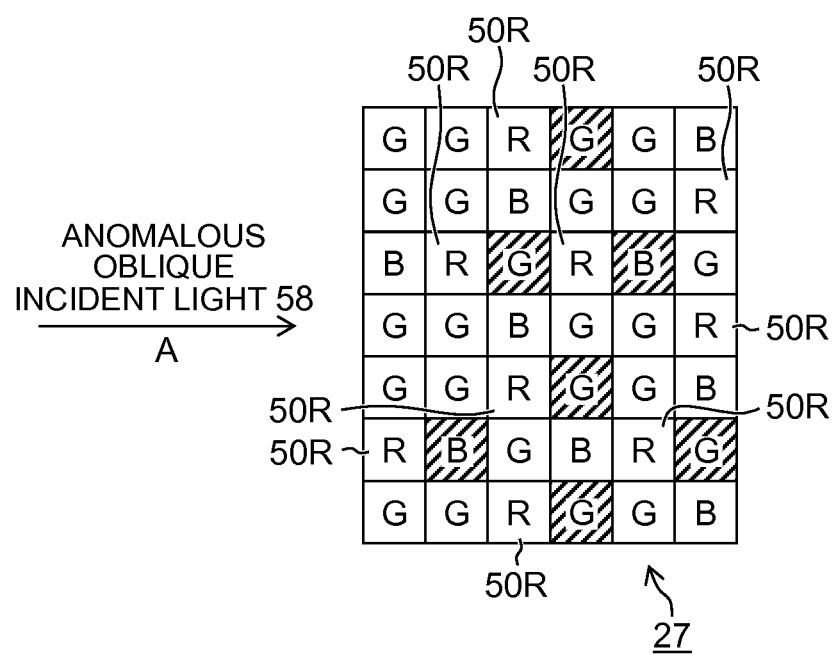
FIG. 4 is an illustration showing a pixel undergoing an effect from color mixture caused by a red anomalous oblique incident light in a horizontal direction.

Therefore, in the pixel 50 adjacent to the R pixel 50R in an incident direction of the red anomalous oblique incident light 58, the color mixing phenomenon caused by the red anomalous oblique incident light 58 is likely to occur. For example, if the red anomalous oblique incident light 58 is incident on the color image pickup device 27 in the horizontal direction (direction of an arrow A in FIG. 4), it is preferable to detect and correct the color mixture in the "pixel adjacent to the R pixel 50R in the incident direction of the red anomalous oblique incident light 58" that is shown hatched in FIG. 4.

Hereinafter, a description is given of an aspect in which the detection and color mixture correction of the red anomalous oblique incident light 58 are performed with a particular pixel not contributing to creation of the image being not inserted into a plurality of pixels in the color image pickup device 27, with focusing on that the color mixture caused by this red anomalous oblique incident light 58 has directionality in a case where a flare phenomenon is caused by the red anomalous oblique incident light 58 containing the red wavelength range component as a main component.

Figure 5:
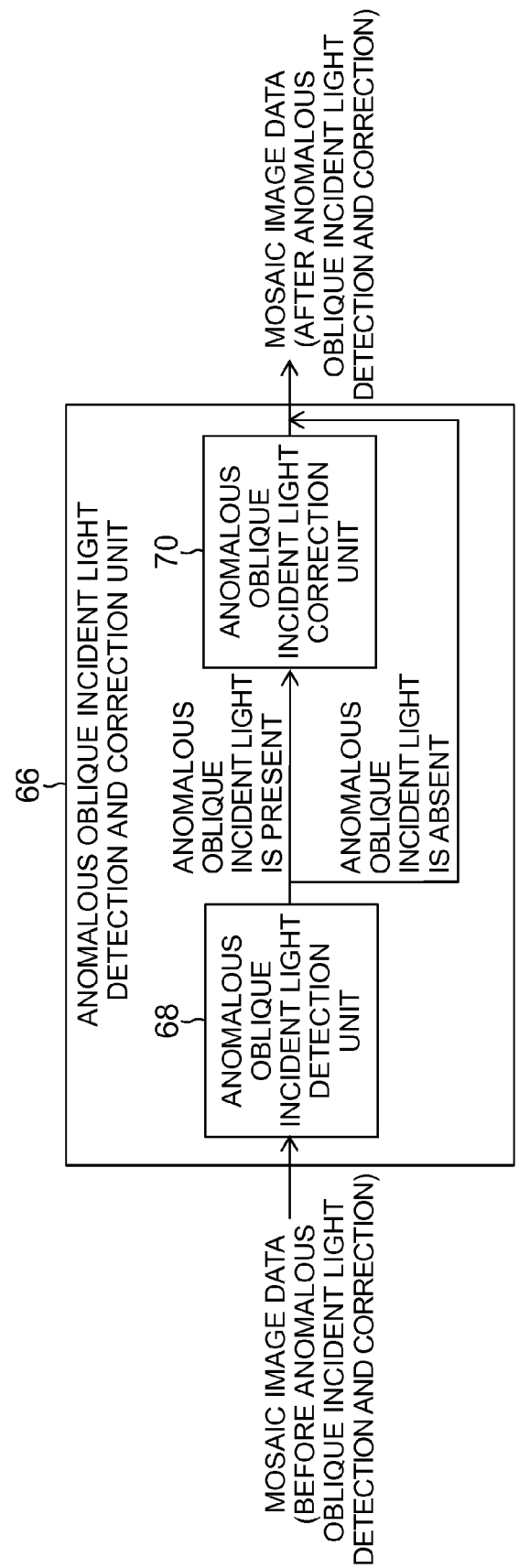
FIG. 5 is a block diagram showing a function configuration of an anomalous oblique incident light detection and correction unit in an image processing circuit shown in FIG. 1.

FIG. 5 is a block diagram showing a function configuration of an anomalous oblique incident light detection and correction unit 66 in the image processing circuit 32 in FIG. 1.

The anomalous oblique incident light detection and correction unit 66 includes an anomalous oblique incident light detection unit (an anomalous oblique incident light detection device) 68 detecting the red anomalous oblique incident light 58 and an anomalous oblique incident light correction unit (a correction device) 70 correcting an effect on a captured image from the red anomalous oblique incident light 58 in response to a detection result by the anomalous oblique incident light detection unit 68.

The anomalous oblique incident light detection unit 68 detects whether or not the red anomalous oblique incident light 58 is incident on the color image pickup device 27 on the basis of the pixel data of the plural pixels 50. The anomalous oblique incident light detection unit 68 in this example receives mosaic image data (RAW data or the like) input, analyzes the pixel data of each pixel in the mosaic image data taking into account arrangement positional properties of the pixels of other colors with respect to the R pixel (see the first pair 52 of RB pixels and the second pair 54 of RB pixels in FIGS. 2A to 2C), and detects whether or not the red anomalous oblique incident light 58 is incident and the incident direction of the light 58.

The anomalous oblique incident light correction unit 70 corrects the pixel data of the pixel 50 having the photodiode 64 on which the red anomalous oblique incident light 58 is incident on the basis of the detection result by the anomalous oblique incident light detection unit 68. In other words, the anomalous oblique incident light correction unit 70 determines, of the plural pixels in the color image pickup device 27, the pixel 50 having the photodiode 64 in which the red anomalous oblique incident light 58 is incident, on the basis of the incident direction of the red anomalous oblique incident light 58 detected and determined by the anomalous oblique incident light detection unit 68 and corrects the pixel data of the pixel 50 thus determined. Note that if the anomalous oblique incident light detection unit 68 does not detect the red anomalous oblique incident light 58, the correction processing by the anomalous oblique incident light correction unit 70 is skipped.

The specific method for the detection and color mixture correction of the red anomalous oblique incident light 58 in the anomalous oblique incident light detection unit 68 and the anomalous oblique incident light correction unit 70 depends on the pixel arrangements of the respective colors (color filter arrangement) in the color image pickup device 27. Hereinafter, a description is given of the specific method for the detection and color mixture correction of the red anomalous oblique incident light 58, in association with an arrangement example of the color filter 62.

First Embodiment

Figure 6:
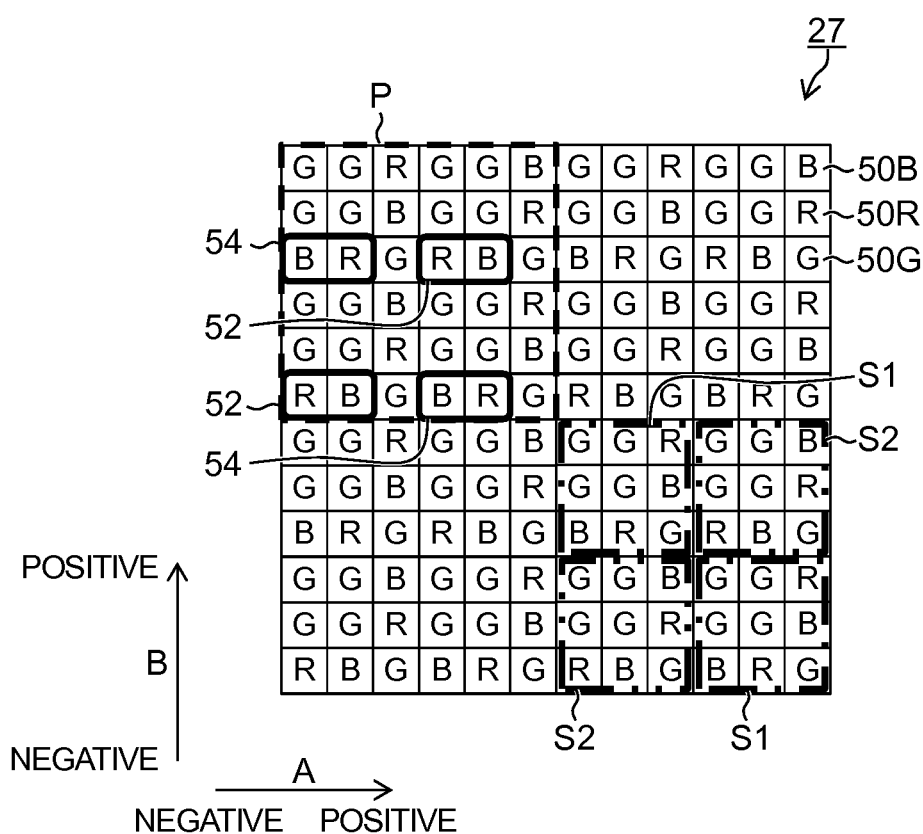
FIG. 6 is an illustration showing a pixel arrangement in a color image pickup device according to a first embodiment.

FIG. 6 is an illustration showing a pixel arrangement in the color image pickup device 27 according to a first embodiment. Plural pixels constituting the color image pickup device 27 in this embodiment include a plurality of basic arrangement pixel groups P each having a color filter arrangement pattern, and these basic arrangement pixel groups P are arrayed repeatedly in the horizontal direction A and a vertical direction B.

The basic arrangement pixel group P in this embodiment is constituted by pixels having an arrangement of 6 pixels×6 pixels in the horizontal direction A and the vertical direction B, and each basic arrangement pixel group P has two first sub arrangements S1 and two second sub arrangements S2 each of which has a pixel arrangement of 3 pixels×3 pixels in the horizontal direction A and the vertical direction B. The first sub arrangements S1 are placed diagonally to each other and the second sub arrangements S2 are placed diagonally to each other in the basic arrangement pixel group P, and each the first sub arrangements S1 is adjacent to the second sub arrangements S2 respectively in the horizontal direction A and the vertical direction B and each of the second sub arrangements S2 is adjacent to the first sub arrangements S1 respectively in the horizontal direction A and the vertical direction B.

In the first sub arrangement S1, there are arrayed in the vertical direction B a row of "G pixel, G pixel, and R pixel", a row of "G pixel, G pixel, and B pixel" and a row of "B pixel, R pixel, and G pixel", in each row the pixels being adjacently arranged in the horizontal direction A. In the second sub arrangement S2, there are arrayed in the vertical direction B a row of "G pixel, G pixel, and B pixel", a row of "G pixel, G pixel, and R pixel", and a row of "R pixel, B pixel, and G pixel", in each row the pixels being adjacently arranged in the horizontal direction A. Therefore, in the basic arrangement pixel group P, there are arrayed in the vertical direction B a row of "G pixel, G pixel, R pixel, G pixel, G pixel, and B pixel", a row of "G pixel, G pixel, B pixel, G pixel, G pixel, and R pixel", a row of "B pixel, R pixel, G pixel, R pixel, B pixel, and G pixel", a row of "G pixel, G pixel, B pixel, G pixel, G pixel, and R pixel", a row of "G pixel, G pixel, R pixel, G pixel, G pixel, and B pixel", and a row of "R pixel, B pixel, G pixel, B pixel, R pixel, and G pixel", in each row the pixels being adjacently arranged in the horizontal direction A.

Therefore, the basic arrangement pixel group P has two first pairs 52 of RB pixels and two second pairs 54 of RB pixels in which the R pixel and the B pixel are arranged to be replaced with each other in the horizontal direction A and the vertical direction B, that is, the R pixel and the B pixel are arranged at positions opposite to each other.

The plural pixels in the color image pickup device 27 in this embodiment divided into a plurality of pixel blocks 72 (see FIG. 7A) for detecting the red anomalous oblique incident light 58 in the horizontal direction A and a plurality of pixel blocks 72 (see FIG. 7B) for detecting the red anomalous oblique incident light 58 in the vertical direction B. Each of a plurality of pixel blocks 72 includes pixels constituting the first pair 52 of RB pixels and the second pair 54 of RB pixels and pixels adjacent to the pixels constituting the first pair 52 of RB pixels and the second pair 54 of RB pixels.

For example, a plurality of pixel block 72 for detecting the red anomalous oblique incident light 58 in the horizontal direction A are constituted by "pixels of 3 pixels (horizontal direction A)×6 pixels (vertical direction)", and a plurality of pixels constituting the color image pickup device 27 are classified into any of these pixel blocks 72. In each of the pixel blocks 72 shown in FIG. 7A, there are arrayed in the vertical direction B a row of "G pixel, G pixel, and R pixel", a row of "R pixel, B pixel, and G pixel", a row of "G pixel, G pixel, and R pixel", a row of "G pixel, G pixel, and B pixel", a row of "B pixel, R pixel, and G pixel", and a row of "G pixel, G pixel, and B pixel", in each row the pixels being adjacently arranged in the horizontal direction A. Therefore, each pixel block 72 includes one first pair 52 of RB pixels and one second pair 54 of RB pixels, and the first pair 52 of RB pixels and the second pair 54 of RB pixels in the pixel block 72 are arranged at a distance (interval) of three pixels in the vertical direction B. The pixel blocks 72 adjacent to each other in the horizontal direction A are arranged at positions shifted by half a pixel block (3 pixels in this embodiment) in vertical direction B.

The anomalous oblique incident light detection unit 68 (see FIG. 5) detects the red anomalous oblique incident light 58 for each pixel block 72. Specifically, the anomalous oblique incident light detection unit 68 compares in each pixel block 72 the pixel data of the B pixel of the first pair 52 of RB pixels with the pixel data of the B pixel of the second pair 54 of RB pixels to detect whether or not the red anomalous oblique incident light 58 is incident.

As described with reference to FIGS. 2B and 2C, the output pixel data value of the pixel adjacent to the R pixel (B pixel in FIG. 2B) in the incident direction of the red anomalous oblique incident light 58 is increased owing to the red anomalous oblique incident light 58. On the other hand, the output pixel data value of the pixel adjacent to the R pixel in a direction different from the incident direction of the red anomalous oblique incident light 58 is not increased owing to the red anomalous oblique incident light 58 (see FIG. 2C).

Therefore, the pixel data of the same color pixels near arranged at a distance of several pixels are often equal or approximated to each other, but in a case where the red anomalous oblique incident light 58 is incident, even the same color pixels near arranged are increased in the output pixel data. In this way, in a case where a difference in the arrangement of the pixels adjacent to the R pixel in the horizontal direction A causes the red anomalous oblique incident light 58 in the horizontal direction A to be incident, only the output pixel data value of the B pixel in one pair of the first pair 52 of RB pixels and the second pair 54 of RB pixels is increased. Thus, when the anomalous oblique incident light detection unit 68 detects anomalous increase of the B pixel output pixel data in one pair of the first pair 52 of RB pixels and the second pair 54 of RB pixels, the unit 68 detects the red anomalous oblique incident light 58 incident on the corresponding pixel block 72.

Figure 7A:
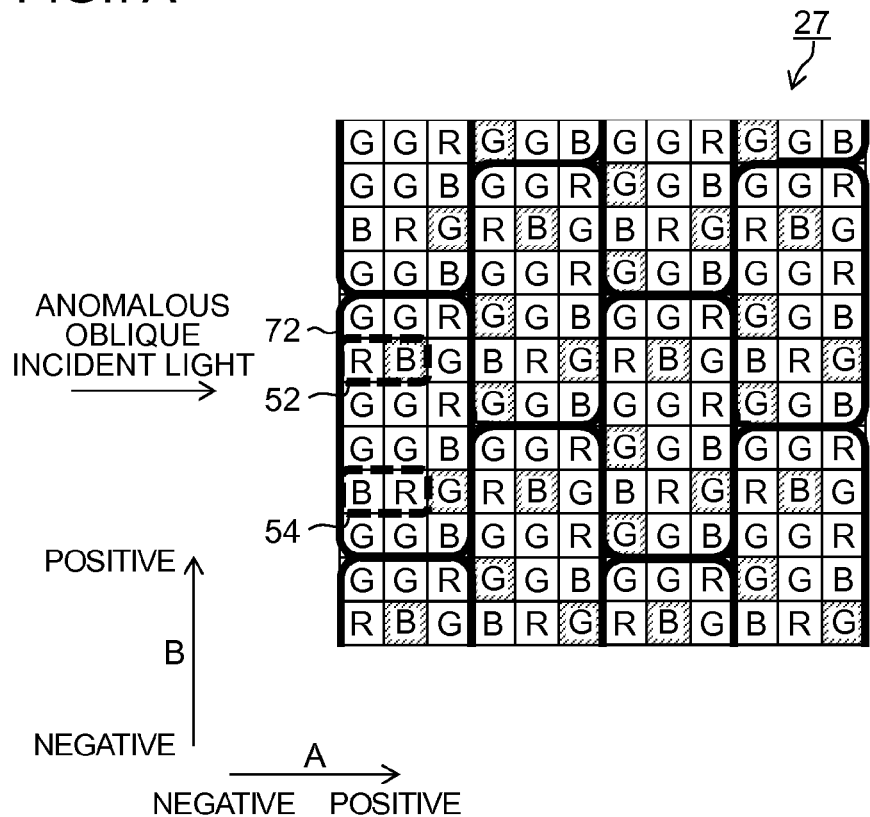
FIG. 7A is an illustration showing a pixel block and shows a pixel block used in detecting the red anomalous oblique incident light in a horizontal direction.

For example, in FIG. 7A, in a case where the pixel data of the B pixel of the first pair 52 of RB pixels which are adjacent to each other in order of "R pixel and B pixel" in the horizontal direction A (positive direction) is larger than the pixel data of the B pixel of the second pair 54 of RB pixels which are adjacent to each other in order of "B pixel and R pixel", it can be determined that the red anomalous oblique incident light 58 travelling in the positive direction of the horizontal direction A is incident on the relevant pixel block 72. On the other hand, in a case where the pixel data of the B pixel of the first pair 52 of RB pixels is smaller than the pixel data of the B pixel of the second pair 54 of RB pixels, it can be determined that the red anomalous oblique incident light 58 travelling in the negative direction of the horizontal direction A is incident on the relevant pixel block 72.

In this way, the anomalous oblique incident light detection unit 68 can determine the incident direction of the red anomalous oblique incident light 58 on the basis of a magnitude relationship between a value of the pixel data of the B pixel of the first pair 52 of RB pixels and a value of the pixel data of the B pixel of the second pair 54 of RB pixels.

Figure 8:
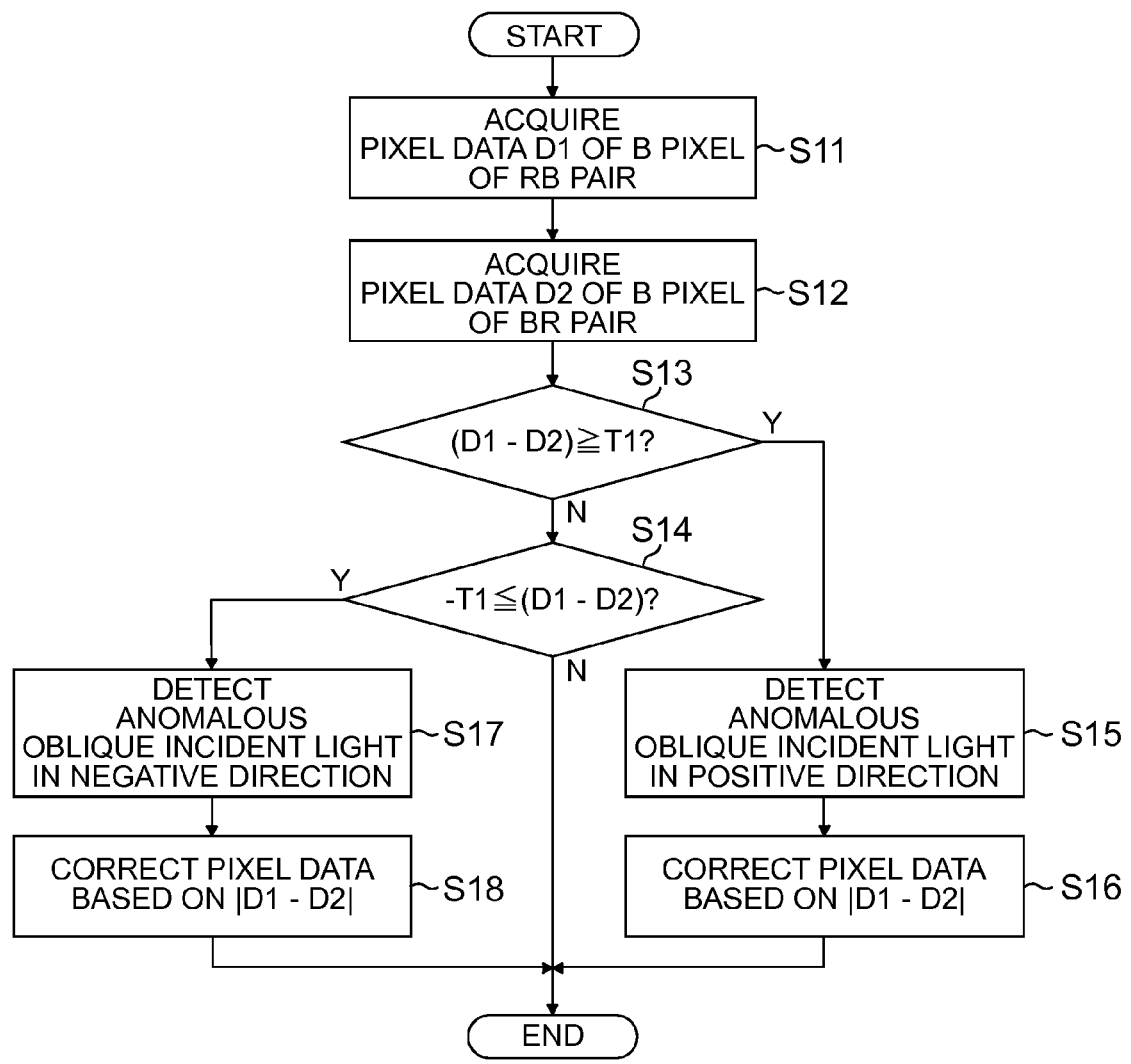
FIG. 8 is a flowchart showing a flow of detection and color mixture correction of a red anomalous oblique incident light in the first embodiment.

In this case, it can be determined whether or not the red anomalous oblique incident light 58 is incident by comparing a difference value between the pixel data of the B pixels of the first pair 52 of RB pixels and second pair 54 of RB pixels with a threshold (see "T1" and "−T1" shown in FIG. 8). In other words, if an absolute value of the difference value between the pixel data of the B pixels of the first pair 52 of RB pixels and second pair 54 of RB pixels is larger than the threshold, it can be determined that the red anomalous oblique incident light 58 is incident on the relevant pixel block 72.

The "threshold" used at this time may be adequately defined depending on properties of the anomalous oblique incident light (flare light or the like) that is a target to be detected. For example, the "threshold" may be set to a value which is larger than the pixel data value due to the detection error and equal to or less than the pixel data value of a visually distinguished degree of the anomalous oblique incident light such that a detection error due to pixel properties is prevented from being erroneously detected as an incidence of the anomalous oblique incident light and such that the anomalous oblique incident light visually distinguished can be detected.

The anomalous oblique incident light correction unit 70 corrects pixel data of a pixel having the photodiode 64 on which the red anomalous oblique incident light 58 is incident on the basis of the pixel data of the B pixel of the first pair 52 of RB pixels and the pixel data of the B pixel of the second pair 54 of RB pixels, in the pixel block 72 including the first pair 52 of RB pixels and the second pair 54 of RB pixels where it is detected by the anomalous oblique incident light detection unit 68 that the red anomalous oblique incident light 58 is incident. In other words, the anomalous oblique incident light correction unit 70 corrects the pixel data of the pixel having the photodiode 64 on which the red anomalous oblique incident light 58 is incident on the basis of the difference value between the pixel data of the B pixel of the first pair 52 of RB pixels and the pixel data of the B pixel of the second pair 54 of RB pixels.

In this embodiment, the difference value between the pixel data of the B pixel of the first pair 52 of RB pixels and the pixel data of the B pixel of the second pair 54 of RB pixels is regarded as a flare component (red anomalous oblique incident light component) so that the color mixture correction is performed. Therefore, the difference absolute value between the pixel data of the B pixels of the first pair 52 of RB pixels and second pair 54 of RB pixels in the pixel block 72 is set as a correction value, and the pixel data is corrected for each pixel block 72 on the basis of this difference absolute value. The anomalous oblique incident light correction unit 70 subtracts this correction value from the pixel data value of the pixel on which the red anomalous oblique incident light 58 is incident (see pixels shown hatched in FIG. 7A) to perform the color mixture correction.

The above description explains the processing in the detection and color mixture correction of the red anomalous oblique incident light 58 in the horizontal direction A, but the detection and color mixture correction of the red anomalous oblique incident light 58 in the vertical direction B can also be performed as is in the detection and color mixture correction of the red anomalous oblique incident light 58 in the horizontal direction A.

Figure 7B:
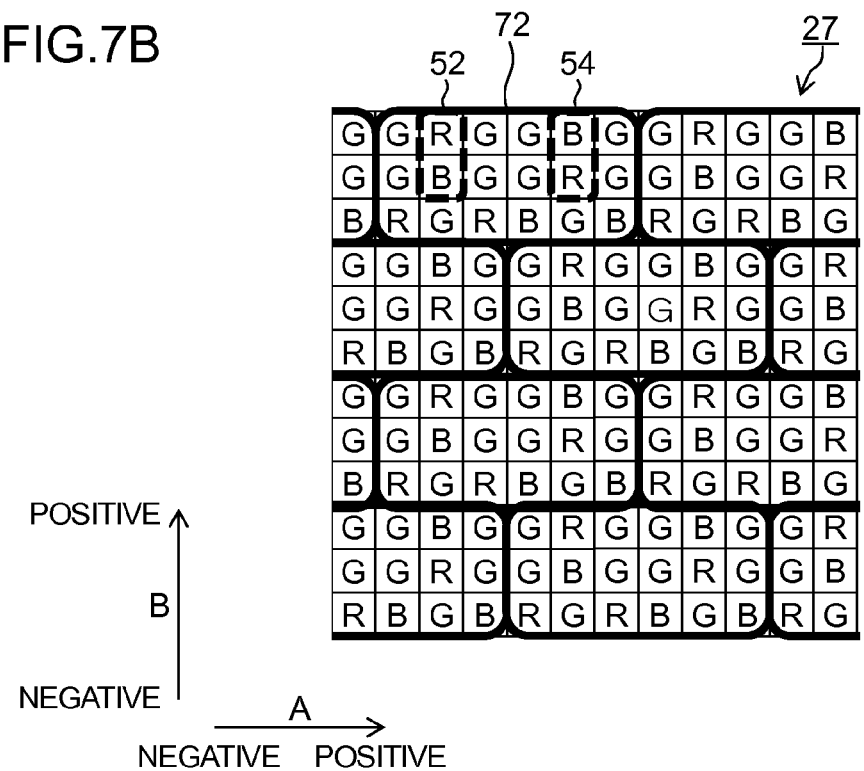
FIG. 7B is an illustration showing a pixel block and shows a pixel block used in detecting the red anomalous oblique incident light in a vertical direction.

For example, each of the plural pixels in the color image pickup device 27 is classified into a pixel block having 6 pixels (horizontal direction A)×3 pixels (vertical direction B) as shown in FIG. 7B. The anomalous oblique incident light detection unit 68 detects whether or not the red anomalous oblique incident light 58 is incident and determines the incident direction on the basis of a difference value between the output pixel data of the B pixels of the first pair 52 of RB pixels and second pair 54 of RB pixels, the first pair 52 of RB pixels being adjacent to each other in order of "R pixel and B pixel" and the second pair 54 of RB pixels being adjacent to each other in order of "B pixel and R pixel" in the vertical direction B (negative direction) in each pixel block 72, and the anomalous oblique incident light correction unit 70 can correct the color mixture caused by the red anomalous oblique incident light 58.

Therefore, according to this embodiment, the detection and color mixture correction of the red anomalous oblique incident light 58 in the horizontal direction A (right and left direction) and the detection and color mixture correction of the red anomalous oblique incident light 58 in vertical direction B (up and down direction) can be performed independently of each other. This makes it possible according to this embodiment that, even in a case, for example, where the red anomalous oblique incident light 58 is incident on the color image pickup device 27 in an oblique direction (a direction at a certain angle with respect to the horizontal direction A and the vertical direction B), the red anomalous oblique incident light 58 is divided into a horizontal direction component and a vertical direction component to be subjected to the detection and color mixture correction.

FIG. 8 is a flowchart showing a flow of the detection and color mixture correction of the red anomalous oblique incident light 58 in the first embodiment. The following description is given of the detection and color mixture correction of the red anomalous oblique incident light 58 in the horizontal direction A, but the detection and color mixture correction of the red anomalous oblique incident light 58 in the vertical direction B can be similarly performed.

First, pixel data D1 of the B pixel of the first pair 52 of RB pixels and pixel data D2 of the B pixel of the second pair 54 of RB pixels are acquired from the input mosaic image data by the anomalous oblique incident light detection unit 68 (S11 and S12 in FIG. 8).

Then, the anomalous oblique incident light detection unit 68 calculates a difference value between the pixel data D1 of the B pixel of the first pair 52 of RB pixels and the pixel data D2 of the B pixel of the second pair 54 of RB pixels, and on the basis of this difference value the anomalous oblique incident light detection unit 68 detects whether nor not the red anomalous oblique incident light 58 is incident in the horizontal direction. Specifically, whether or not the difference value (D1−D2) of the pixel data is equal to or more than a threshold T1 (S13), and if the difference value (D1−D2) of the pixel data is more than the threshold T1 (Y in S13), it is detected that the red anomalous oblique incident light 58 is incident in the positive direction of the horizontal direction A (S15).

If it is detected that the red anomalous oblique incident light 58 is incident in the positive direction of the horizontal direction, a pixel on which the red anomalous oblique incident light 58 is incident in the positive direction is determined by the anomalous oblique incident light correction unit 70, and pixel data of the pixel on which the red anomalous oblique incident light 58 is incident is corrected by the anomalous oblique incident light correction unit 70 on the basis of an absolute value |D1−D2| of the difference value of the pixel data (S16).

On the other hand, if the difference value (D1−D2) of the pixel data is smaller than the threshold T1 (N in S13), whether or not the difference value (D1−D2) of the pixel data is equal to or less than the threshold −T1 is determined (S14), and if the difference value (D1=D2) of the pixel data is equal to or less than the threshold −T1 (Y in S14), it is detected by the anomalous oblique incident light detection unit 68 that the red anomalous oblique incident light 58 is incident in the negative direction of the horizontal direction (S17). If it is detected that the red anomalous oblique incident light 58 is incident in the negative direction of the horizontal direction, a pixel on which the red anomalous oblique incident light 58 is incident in the negative direction is detected by the anomalous oblique incident light correction unit 70, and pixel data of the pixel on which the red anomalous oblique incident light 58 is incident is corrected by the anomalous oblique incident light correction unit 70 on the basis of the absolute value |D1−D2| of the difference value of the pixel data (S18).

If the difference value (D1=D2) of the pixel data is smaller than the threshold T1 (N in S13) and the difference value (D1=D2) of the pixel data is larger than the threshold −T1 (N in S14), it is determined that the red anomalous oblique incident light 58 is not incident in the horizontal direction, and the correction processing in the anomalous oblique incident light correction unit 70 is skipped.

As described above, according to this embodiment, the comparison of the pixel data, with taking into account the arrangement properties of the pixels of the respective colors in the mosaic image data, allows the detection and color mixture correction of the anomalous oblique incident light such as the flare light with a good accuracy.

Particularly, the anomalous oblique incident light detection device and method in this embodiment can detect the anomalous oblique incident light on the basis of the arrangement properties of the pixels of the respective colors in the color image pickup device 27 and the pixel data constituting the mosaic image data, not putting a limit on an optical system including the lens or the like used in imaging.

Performing the processing with the pixel in the color image pickup device 27 being classified into a plurality of pixel blocks 72 makes it possible to flexibly respond to variation of an incident angle of the red anomalous oblique incident light 58, and also to respond to cases where a plurality of flare lights different in the intensity thereof are incident on the color image pickup device 27, where a ghost light is incident on a part of the color image pickup device 27, and where an old lens having a steep incident angle at all or the like is used.

First Modification Example

The above described embodiment shows the example in which the detection and color mixture correction of the red anomalous oblique incident light 58 in the horizontal direction A/vertical direction B is performed in units of the pixel block 72, but, the red anomalous oblique incident light 58 may be detected if the absolute value of the difference value between the pixel data of the B pixels of the first pair 52 of RB pixels and second pair 54 of RB pixels is large in a range having a predetermined size in the plural pixels in the color image pickup device 27.

In other words, the difference value between the pixel data of the B pixels of the first pair 52 of RB pixels and second pair 54 of RB pixels in the pixel block 72 is found by the anomalous oblique incident light detection unit 68 as in the embodiment described above. Then, in the case where "the difference value (D1=D2) between the pixel data of the B pixels of the first pair 52 of RB pixels and second pair 54 of RB pixels is equal to or more than the threshold T1" or "the difference value (D1=D2) between the pixel data of the B pixels of the first pair 52 of RB pixels and second pair 54 of RB pixels is equal to or less than the threshold −T1" for all the pixel blocks 72 included in a predetermined range, the anomalous oblique incident light detection unit 68 may determine that the red anomalous oblique incident light 58 is incident on that predetermined range.

In this way, the incidence of the red anomalous oblique incident light 58 is detected in the case where a result is identical in a predetermined range, the result being obtained by comparing the difference value (D1=D2) between the pixel data of the B pixels of the first pair 52 of RB pixels and second pair 54 of RB pixels with the thresholds T1 and −T1, such that an accuracy for detecting the anomalous oblique incident light is improved to allow the captured image having a high resolution to be achieved.

Note the "predetermined range" referred herein can be adequately defined depending on properties of the anomalous oblique incident light (flare light or the like) that is a target to be detected. For example, a visually distinguished degree of range may also be set to the "predetermined range", and for example, a "range of 64 pixels (horizontal direction A)×64 pixels (vertical direction B)" or a "range of 30 pixels (horizontal direction A)×30 pixels (vertical direction B)" may be set to the "predetermined range".

Second Modification Example

In the above described embodiment, the color mixture correction is performed by subtracting the absolute value (correction value) of the difference value between the pixel data of the B pixels of the first pair 52 of RB pixels and second pair 54 of RB pixels from the pixel data value of the pixel on which the red anomalous oblique light 58 is incident, but the color mixture correction is not limited to this method.

For example, the anomalous oblique incident light correction unit 70 can also correct the pixel data of the pixel having the photodiode 64 on which the red anomalous oblique incident light 58 is incident on the basis of pixel data of a pixel which has a color filter of the same color as the pixel having the photodiode 64 on which the red anomalous oblique incident light 58 is incident and which has a photodiode 64 on which the red anomalous oblique incident light 58 is not incident. The "pixel which has a photodiode 64 on which the red anomalous oblique incident light 58 is not incident" referred herein is a pixel not adjacent to the R pixel in the incident direction of the red anomalous oblique incident light 58.

Therefore, in each pixel block 72, pixel data of a target pixel to be corrected (pixel having the photodiode 64 on which the red anomalous oblique incident light 58 is incident) adjacent to the R pixel in the incident direction of the red anomalous oblique incident light 58 may be corrected on the basis of pixel data of a pixel which has a color filter of the same color as the target pixel to be corrected and which is not adjacent to the R pixel in the incident direction of the red anomalous oblique incident light 58. In this case, the color mixture correction may be performed by substituting the pixel data of the target pixel to be corrected with pixel data of a pixel in the same pixel block 72 not adjacent to the R pixel in the incident direction of the red anomalous oblique incident light 58 or with an average value or weighted average value of the plural same color pixels in the same pixel block 72.

Third Modification Example

The above described embodiment explains the example in which the arrangement properties and output pixel data of a pair of R pixel and B pixel set (the first pair 52 of RB pixels and the second pair 54 of RB pixels) are used, but the detection and color mixture correction of the red anomalous oblique incident light 58 may be performed also by use of a pair of other colors pixels.

For example, instead of the "B pixel" of the first pair 52 of RB pixels and second pair 54 of RB pixels, the "G pixel" may be used, which enables the detection and color mixture correction of the red anomalous oblique incident light 58 to be achieved on the basis of a difference value between pixel data of the G pixels of a pair of adjacent pixels of "R pixel and G pixel" and pair of adjacent pixels of "G pixel and R pixel" in each of the horizontal direction and the vertical direction, similarly to the embodiment described above that is on the basis of the difference value between the pixel data of the B pixels.

However, a B color filter of the RGB color filters has a peak of the transmission rate on the shortest wavelength side where the pixel data of the B pixel is the hardest to be saturated by the red anomalous oblique incident light, and thus, the use of the B pixel can effectively prevent the red anomalous oblique incident light 58 from being erroneously detected.

In a case where the plural pixels constituting the color image pickup device 27 include, besides the RGB pixel, a W pixel (transparent pixel, white pixel), the "W pixel" may be used instead of the "R pixels" of the first pair 52 of RB pixels and second pair 54 of RB pixels. In this case, the detection and color mixture correction of the red anomalous oblique incident light 58 is enabled to be achieved on the basis of a difference value between pixel data of the B pixels of a pair of adjacent pixels of "W pixel and B pixel" and pair of adjacent pixels of "W pixel and B pixel" in each of the horizontal direction and the vertical direction, similarly to the embodiment described above.

Therefore, in a case where the color image pickup device 27 includes the RGBW pixels, it may be such that any of the red filter, transparent filter and white filter is used as a first-color color filter, and any of the blue filter and the green filter is used as a second-color color filter, and a "pixel including the first-color color filter" and a "pixel including the second-color color filter" which are arranged adjacent to each other are used instead of the R pixels and B pixels of the first pair 52 of RB pixels and second pair 54 of RB pixels described above.

The color image pickup device 27 may include a pixel having a color filter of a color other than red, green, blue, transparent, and white, and a color filter of a color having a relatively high light transmission rate in at least a part of the red light wavelength range may be used as the above first-color color filter and a color filter of a color having a relatively low light transmission rate may be used as the above second-color color filter.

Even in a case where any color filter is used instead of the R pixels and B pixels of the first pair 52 of RB pixels and second pair 54 of RB pixels, the larger a difference between the transmission rates in a light wavelength range as the target to be detected, the more the detection accuracy can be improved, which is preferable. Therefore, in the case of performing the detection and color mixture correction of the anomalous oblique incident light in the red wavelength range, the pair of "W pixel and B pixel" or "R pixel and B pixel" is preferable as a pair of adjacent pixels included in the pixel block 72.

The transparent pixel and the white pixel both have a color filter having a relatively high light transmission rate throughout the visible light wavelength range, but the color filter of transparent pixel has the light transmission rate higher than the color filter of white pixel.

Second Embodiment

Figure 9A:
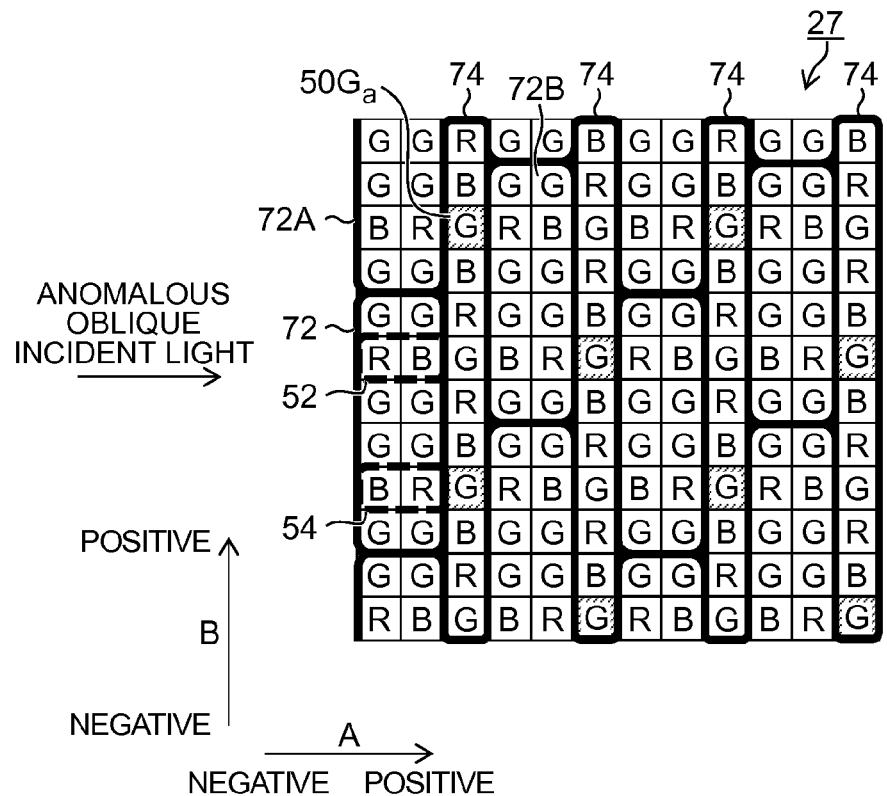
FIG. 9A is an illustration showing a pixel arrangement in a color image pickup device according to a second embodiment and shows a pixel block used in detecting a red anomalous oblique incident light in a horizontal direction.
Figure 9B:
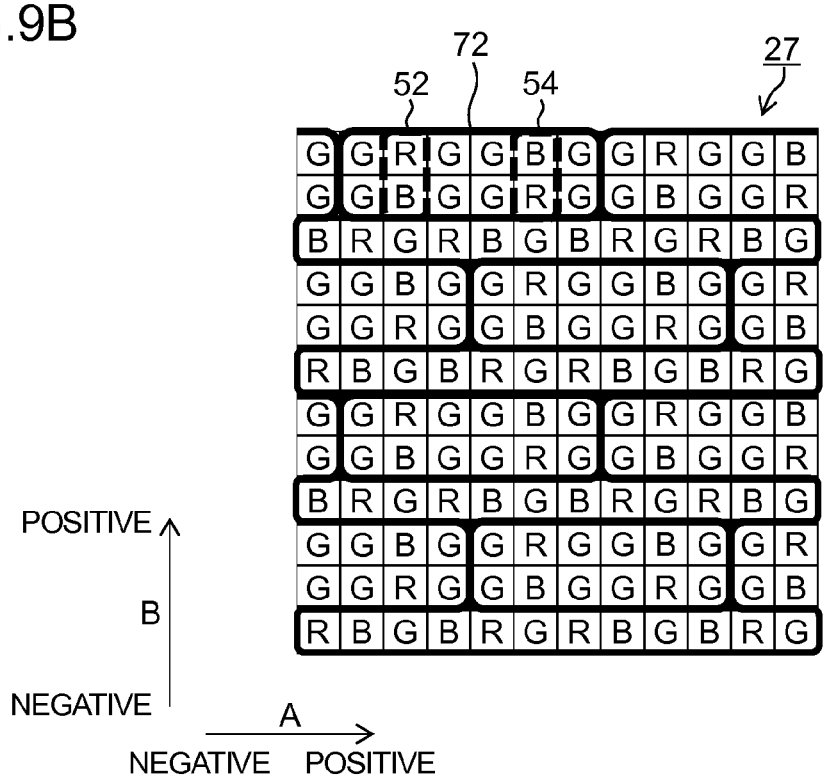
FIG. 9B is an illustration showing a pixel arrangement in the color image pickup device according to the second embodiment and shows a pixel block used in detecting the red anomalous oblique incident light in a vertical direction.

FIGS. 9A and 9B are illustrations each showing a pixel arrangement in the color image pickup device 27 according to a second embodiment, and FIG. 9A shows the pixel block 72 used in detecting the red anomalous oblique incident light in the horizontal direction A, and FIG. 9B shows the pixel block 72 used in detecting the red anomalous oblique incident light in the vertical direction B.

The components the same as or similar to those in the first embodiment and modification examples described above are designated by the same reference numerals or signs, and their detailed description is omitted.

The entire pixel arrangement (color filter arrangement) in the color image pickup device 27 in this embodiment is the same as that in the first embodiment, but the plural pixels include the plural pixel blocks 72 and a plurality of buffer blocks 74 disposed between the pixel blocks 72.

Each of the pixel blocks 72 shown in FIG. 9A is constituted by "2 pixels (horizontal direction A)×6 pixels (vertical direction B)", and there are arrayed in the vertical direction B a row of "G pixel and G pixel", a row of "R pixel and B pixel", a row of "G pixel and G pixel", a row of "G pixel and G pixel", a row of "B pixel and R pixel", and a row of "G pixel and G pixel", in each row the pixels being adjacently arranged in the horizontal direction A. Therefore, each pixel block 72 in this embodiment also includes one first pair 52 of RB pixels and one second pair 54 of RB pixels, and the first pair 52 of RB pixels and the second pair 54 of RB pixels in the pixel block 72 are arranged at a distance (interval) of three pixels in the vertical direction B. The pixel blocks 72 adjacent to each other in the horizontal direction A are arranged at positions shifted by half a pixel block (3 pixels in this embodiment) in the vertical direction B.

The buffer block 74 is constituted by a group of pixels adjacently arranged in the vertical direction B having one pixel in the horizontal direction A.

Each of the plural pixels is classified into any of these plural pixel blocks 72 and plural buffer blocks 74.

The detection and color mixture correction of the red anomalous oblique incident light 58 is performed on the pixel data of the pixels in the pixel block 72 similarly to the first embodiment described above. In other words, the anomalous oblique incident light detection unit 68 detects whether or not the red anomalous oblique incident light 58 is incident and the incident direction of the light 58 on the basis of the difference value of the pixel data of the B pixels of the first pair 52 of RB pixels and second pair 54 of RB pixels in each pixel block 72, and the anomalous oblique incident light correction unit 70 performs the detection on the color mixture pixels and the color mixture correction by way of the above difference value in response to the detection result by the anomalous oblique incident light detection unit 68.

Meanwhile, the pixel data of the pixels in the buffer block 74 is subjected to the color mixture correction by the anomalous oblique incident light correction unit 70 on the basis of a pixel data correction amount for the pixel block 72 adjacent to the target pixel to be corrected.

The determination on a pixel, of the pixels included in the buffer block 74, having the photodiode 64 on which the red anomalous oblique incident light 58 is incident is performed on the basis of the incident direction of the red anomalous oblique incident light 58 detected by the anomalous oblique incident light detection unit 68 similarly to the first embodiment described above. For example, in a case where the red anomalous oblique incident light 58 in the positive direction of the horizontal direction A is incident on the color image pickup device 27, the anomalous oblique incident light correction unit 70 determines the pixel which is in the buffer block 74 and adjacent to the R pixel in this direction (G pixel shown hatched in FIG. 9A) as a "pixel having the photodiode 64 on which the red anomalous oblique incident light 58 is incident".

Then, the anomalous oblique incident light correction unit 70 subjects the pixel data of the pixel, of the pixels included in the buffer block 74, having the photodiode 64 on which the red anomalous oblique incident light 58 is incident to the color mixture correction on the basis of a color mixture correction amount for the pixel data of the pixel, in the pixel block 72 adjacent to the buffer block 74, having the photodiode 64 on which the red anomalous oblique incident light 58 is incident.

For example, the color mixture correction amount for the pixel data of a "G pixel $50G_a$" in the buffer block 74 shown in FIG. 9A is determined by the anomalous oblique incident light correction unit 70 on the basis of the color mixture correction amount for a pixel block 72A which is adjacent to and on the negative direction side in the horizontal direction A of the G pixel $50G_a$ and the color mixture correction amount for a pixel block 72B which is adjacent to and on the positive direction side in the horizontal direction A of the G pixel $50G_a$.

Any interpolation method may be used for a determination method of the color mixture correction amount at this time, and for example, linear interpolation or spline interpolation may be used to determine, on the basis of the color mixture correction amount for the adjacent pixel block 72, the color mixture correction amount for the pixel data of the pixel, of the pixels in the buffer block 74, having the photodiode 64 on which the red anomalous oblique incident light 58 is incident.

Note the detection and color mixture correction of the red anomalous oblique incident light 58 in the vertical direction B can also be performed similarly to the detection and color mixture correction of the red anomalous oblique incident light 58 in the horizontal direction A described above.

For example, as shown in FIG. 9B, each pixel block 72 is constituted by "6 pixels (horizontal direction A)×2 pixels (vertical direction)" in which there are arrayed in the vertical direction B a row of "G pixel, R pixel, G pixel, G pixel, B pixel, and G pixel" and a row of "G pixel, B pixel, G pixel, G pixel, R pixel, and G pixel", in each row the pixels being adjacently arranged in the horizontal direction A. The buffer block 74 between the pixel blocks 72 is constituted by a group of pixels adjacently arranged in the horizontal direction A having one pixel in the vertical direction B. Each of the plural pixels is classified into any of these plural pixel blocks 72 and plural buffer blocks 74, and the detection and color mixture correction of the red anomalous oblique incident light 58 is performed on the pixel data of the pixel in the pixel block 72 similarly to the first embodiment described above. The detection and color mixture correction of the red anomalous oblique incident light 58 is performed on the pixel data of the pixel in the buffer block 74 similarly to the case of the red anomalous oblique incident light 58 in the horizontal direction A described above, specifically, the anomalous oblique incident light correction unit 70 performs the color mixture correction on the basis of the color mixture correction amount for the pixel block 72 adjacent to the target pixel to be corrected.

As described above, according to this embodiment, the buffer block 74 is deposed between the pixel blocks 72 such that the color mixture correction on the pixel data of the pixel in the buffer block 74 is performed on the basis of the color mixture correction amount for the adjacent pixel block 72.

This makes it possible to perform the color mixture correction for the pixel data of the pixel in the buffer block 74 with a high accuracy, obtaining the captured image giving a feeling of more excellent resolution.

The above described embodiment describes the example where the pixel data of the pixel in the buffer block 74 is corrected on the basis of the color mixture correction amount for the adjacent pixel block 72, but, with taking into account the color mixture correction amount for another surrounding pixel block 72 in a range near the target pixel to be corrected, besides the adjacent pixel block 72, the color mixture correction may be performed on the pixel data of the pixel in the buffer block 74.

Third Embodiment

Figure 10:
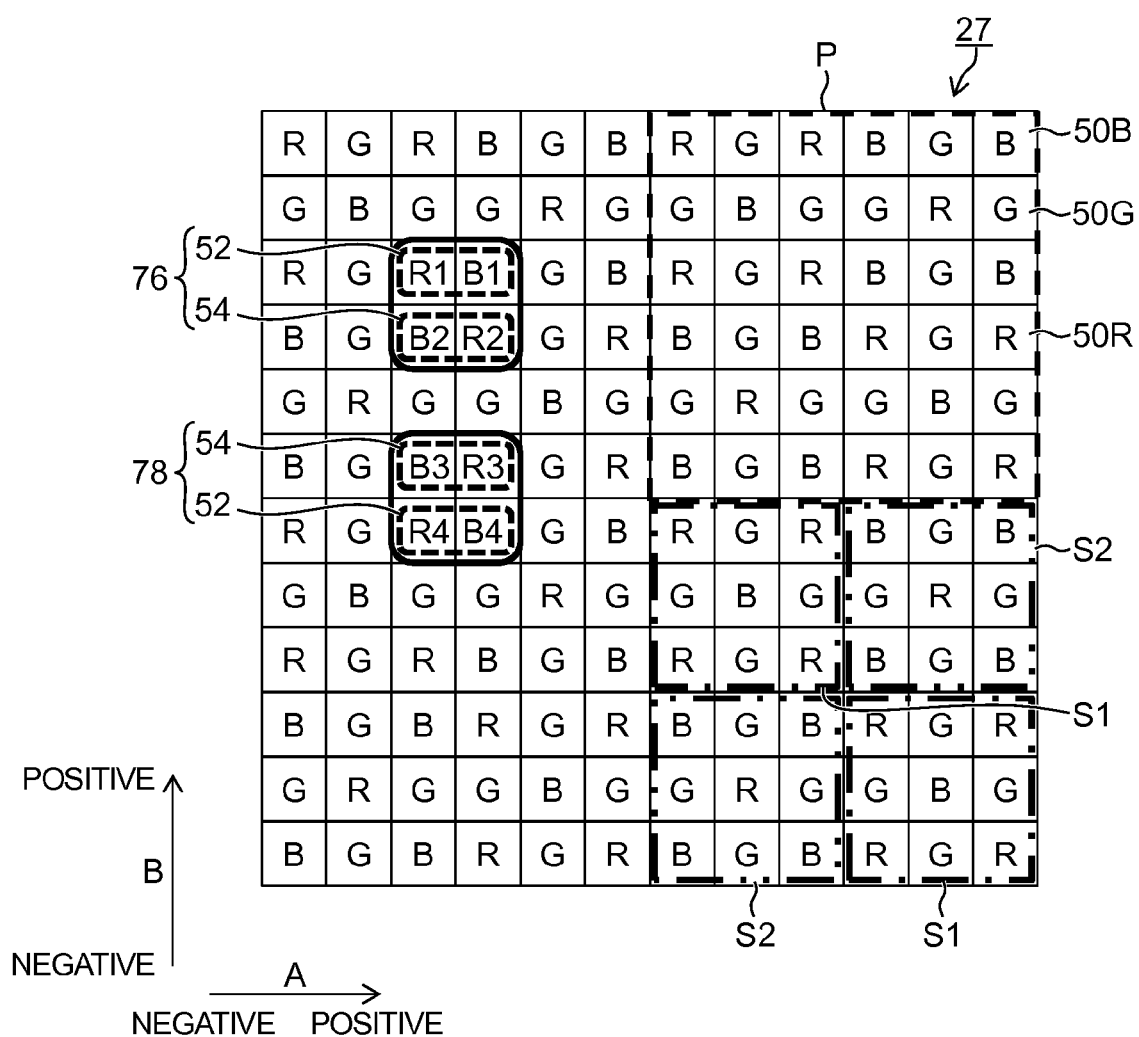
FIG. 10 is an illustration showing a pixel arrangement in a color image pickup device according to a third embodiment.

FIG. 10 is an illustration showing a pixel arrangement in the color image pickup device 27 according to a third embodiment. In this embodiment, the incident direction of the red anomalous oblique incident light 58 is determined by data processing taking into account arrangement properties of two sets of pixel groups (first pixel pair block 76 and second pixel pair block 78).

The components the same as or similar to those in the first embodiment, second embodiment and modification examples described above are designated by the same reference numerals or signs, and their detailed description is omitted.

The basic arrangement pixel group P of the plural pixels constituting the color image pickup device 27 in this embodiment is constituted by pixels having an arrangement of 6 pixels×6 pixels in the horizontal direction A and the vertical direction B, and each basic arrangement pixel group P has two first sub arrangements S1 and two second sub arrangements S2 each of which has a pixel arrangement of 3 pixels×3 pixels in the horizontal direction A and the vertical direction B. The first sub arrangements S1 are placed diagonally to each other and the second sub arrangements S2 are placed diagonally to each other in the basic arrangement pixel group P, and each of the first sub arrangements S1 is arranged adjacent to the second sub arrangements S2 respectively in the horizontal direction A and the vertical direction B and each of the second sub arrangements S2 is arranged adjacent to the first sub arrangements S1 respectively in the horizontal direction A and the vertical direction B.

In the first sub arrangement S1, there are arrayed in the vertical direction B a row of "R pixel, G pixel, and R pixel", a row of "G pixel, B pixel, and G pixel", and a row of "R pixel, G pixel, and R pixel", in each row the pixels being adjacently arranged in the horizontal direction A. In the second sub arrangement S2, there are arrayed in the vertical direction B a row of "B pixel, G pixel, and B pixel", a row of "G pixel, R pixel, and G pixel", and a row of "B pixel, G pixel, and B pixel", in each row the pixels being adjacently arranged in the horizontal direction A. Therefore, in the basic arrangement pixel group P, there are arrayed in the vertical direction B a row of "R pixel, G pixel, R pixel, B pixel, G pixel, and B pixel", a row of "G pixel, B pixel, G pixel, G pixel, R pixel, and G pixel", a row of "R pixel, G pixel, R pixel, B pixel, G pixel, and B pixel", a row of "B pixel, G pixel, B pixel, R pixel, G pixel, and R pixel", a row of "G pixel, R pixel, G pixel, G pixel, B pixel, and G pixel", and a row of "B pixel, G pixel, B pixel, R pixel, G pixel, and R pixel", in each row the pixels being adjacently arranged in the horizontal direction A.

The plural pixels having such an arrangement include the first pixel pair block 76 and the second pixel pair block 78 each constituted by the first pair 52 of RB pixels and the second pair 54 of RB pixels. FIG. 10 shows as an example the first pair 52 of RB pixels and the second pair 54 of RB pixels which are used for the detection and color mixture correction of the red anomalous oblique incident light 58 in the horizontal direction A. The first pixel pair block 76 and the second pixel pair block 78 each have the first pair 52 of RB pixels and the second pair 54 of RB pixels adjacently arranged with 2 pixels being arranged in the horizontal direction A and pixels being arranged in the vertical direction B. The R pixel and the B pixel are arranged to be replaced with each other between the first pixel pair block 76 and the second pixel pair block 78, that is, the position of the R pixel and the position of the B pixel are opposite to each other (see R1 to R4 and B1 to B4 in FIG. 10)

Therefore, the first pixel pair block 76 has the B pixel (B2; first pixel) adjacent to the R pixels one of which is on the positive direction side in the horizontal direction A and the other of which is on the positive direction side in the vertical direction B, and the B pixel (B1; second pixel) adjacent to the R pixels one of which is on the negative direction side in the horizontal direction A and the other of which is on the negative direction side of the vertical direction B. The second pixel pair block 78 has the B pixel (B4; third pixel) adjacent to the R pixels one of which is on the negative direction side in the horizontal direction A and the other of which is on the positive direction side in the vertical direction B, and the B pixel (B3; fourth pixel) adjacent to the R pixels one of which is on the positive direction side in the horizontal direction A and the other of which is on the negative direction side in the vertical direction B.

As for the detection of the red anomalous oblique incident light 58 in the anomalous oblique incident light detection unit 68, it is possible to determine whether or not the red anomalous oblique incident light 58 is incident by comparing the difference value between the pixel data of the B pixels of the first pair 52 of RB pixels and second pair 54 of RB pixels with the threshold as is in the embodiments described above. In this embodiment, the first pair 52 of RB pixels and the second pair 54 of RB pixels are adjacently arranged to constitute the first pixel pair block 76 and the second pixel pair block 78 such that it is possible to determine whether or not the red anomalous oblique incident light 58 is incident on the basis of the difference values between pixel data of the B pixels in both the first pixel pair block 76 and the second pixel pair block 78.

On the other hand, the incident direction of the red anomalous oblique incident light 58 is determined on the basis of the pixel data of two B pixels included in the first pixel pair block 76 and the pixel data of two B pixels included in the second pixel pair block 78. In other words, the anomalous oblique incident light detection unit 68 determines the incident direction of the red anomalous oblique incident light 58 on the basis of a magnitude relationship between the pixel data of two B pixels (B1, B2) included in the first pixel pair block 76 and a magnitude relationship between the pixel data of two B pixels (B3, B4) included in the second pixel pair block 78.

Assume that the pixel data of the B pixel of the first pair 52 of RB pixels (B1) in the first pixel pair block 76 is D1, the pixel data of the B pixel of the second pair 54 of RB pixels (B2) in the first pixel pair block 76 is D2, the pixel data of the B pixel of the second pair 54 of RB pixels (B3) in the second pixel pair block 78 is D3, and the pixel data of the B pixel of the first pair 52 of RB pixels (B4) in the second pixel pair block 78 is D4.

If the pixel data D1 and D2 of the first pixel pair block 76 only is used, the incident direction of the red anomalous oblique incident light 58 cannot be strictly determined from only the pixel data D1 and D2. For example, if the a magnitude relationship of "D1>D2" holds, it is not possible to distinguish between the color mixture due to the red anomalous oblique incident light 58 in the positive direction of the horizontal direction A (color mixture in the B1 pixel due to the R1 pixel) and the color mixture due to the red anomalous oblique incident light 58 in the positive direction of the vertical direction B (color mixture in the B1 pixel due to the R2 pixel).

Therefore, this embodiment calculates the incident direction of the red anomalous oblique incident light 58 on the basis of the pixel data D1 to D4 of the first pixel pair block 76 and the second pixel pair block 78. For example, in the above case (case where the magnitude relationship "D1>D2" holds), if the color mixture in the B1 pixel due to the R1 pixel is dominant, "D4>D3" holds, and if the color mixture in the B1 pixel due to the R2 pixel is dominant, "D3>D4" holds. Specifically, the magnitude relationship between the pixel data of the B pixels (B3, B4) shown in FIG. 10 corresponds to the incident direction of the red anomalous oblique incident light 58 as below.

A case where "D1>D2" and "D3<D4" hold: the red anomalous oblique incident light 58 in the positive direction of the horizontal direction A is incident on the color image pickup device 27.

A case where "D1<D2" and "D3>D4" hold: the red anomalous oblique incident light 58 in the negative direction of the horizontal direction A is incident on the color image pickup device 27.

A case where "D1>D2" and "D3>D4" hold: the red anomalous oblique incident light 58 in the positive direction of the vertical direction B is incident on the color image pickup device 27.

A case where "D1<D2" and "D3<D4" hold: the red anomalous oblique incident light 58 in the negative direction of the vertical direction B is incident on the color image pickup device 27.

Therefore, the anomalous oblique incident light detection unit 68, which has detected the incidence of the red anomalous oblique incident light 58, calculates, for example, the difference values "D1–D2" and "D3–D4" between the pixel data of the B pixels, and determines that the incident direction of the red anomalous oblique incident light 58 is "the positive direction of the horizontal direction A if (D1–D2) is positive and (D3–D4) is negative", "the negative direction of the horizontal direction A if (D1–D2) is negative and (D3–D4) is positive", "the positive direction of the vertical direction B if (D1–D2) is positive and (D3–D4) is positive", and "the negative direction of the vertical direction B if (D1–D2) is negative and (D3–D4) is negative".

The above description explains the processing in the detection and color mixture correction of the red anomalous oblique incident light 58 in the horizontal direction A, but the detection and color mixture correction of the red anomalous oblique incident light 58 in the vertical direction B can also be performed as is in the detection and color mixture correction of the red anomalous oblique incident light 58 in the horizontal direction A. In this case, the pair of RB pixels ("R1 pixel and B2 pixel", "B1 pixel and R2 pixel", "B3 pixel and R4 pixel", and "R3 pixel and B4 pixel" in the example shown in FIG. 10) adjacent to each other in the vertical direction B in the first pixel pair block 76 and the second pixel pair block 78 can be used as the first pair 52 of RB pixels and the second pair 54 of RB pixels.

As described above, according to this embodiment, even in a case where the incident direction of the red anomalous oblique incident light 58 is hard to strictly detect from the output pixel data of only one first pair 52 of RB pixels and one second pair 54 of RB pixels, the incident direction of the red anomalous oblique incident light 58 can be detected with a good accuracy from the output pixel data of the first pixel pair block 76 and the second pixel pair block 78 in which the arrangement positions of the R pixel and B pixel are opposite to each other. In this way, the use of the pixel data of two sets of pixel groups (first pair 52 of RB pixels and second pair 54 of RB pixels) enables the detection and color mixture correction at a time of the red anomalous oblique incident lights 58 in the horizontal direction and the vertical direction (up-and-down and right-and-left directions).

Fourth Embodiment

In a case where a difference between the pixel data of the B pixels is generated in nature due to a color arrangement of the subject image, if the pixel data of both B pixels is made to have the same value by the color mixture correction, the color arrangement of the subject image in nature is lost in resultant image data. Therefore, the difference between the pixel data of the B pixels of two sets of pairs of RB pixels (first pair 52 of RB pixels and second pair 54 of RB pixels) is due to a difference in the color arrangement in units of pixel in the subject image, there are some cases where a feeling of resolution of the resultant image is deteriorated if the color mixture correction is performed by a simple subtraction processing using the difference value between the pixel data of both above.

This embodiment describes an example performing the color mixture correction in which a loss of data concerning the color arrangement of the subject image in nature is decreased to obtain the image data of high resolution feeling.

Figure 11:
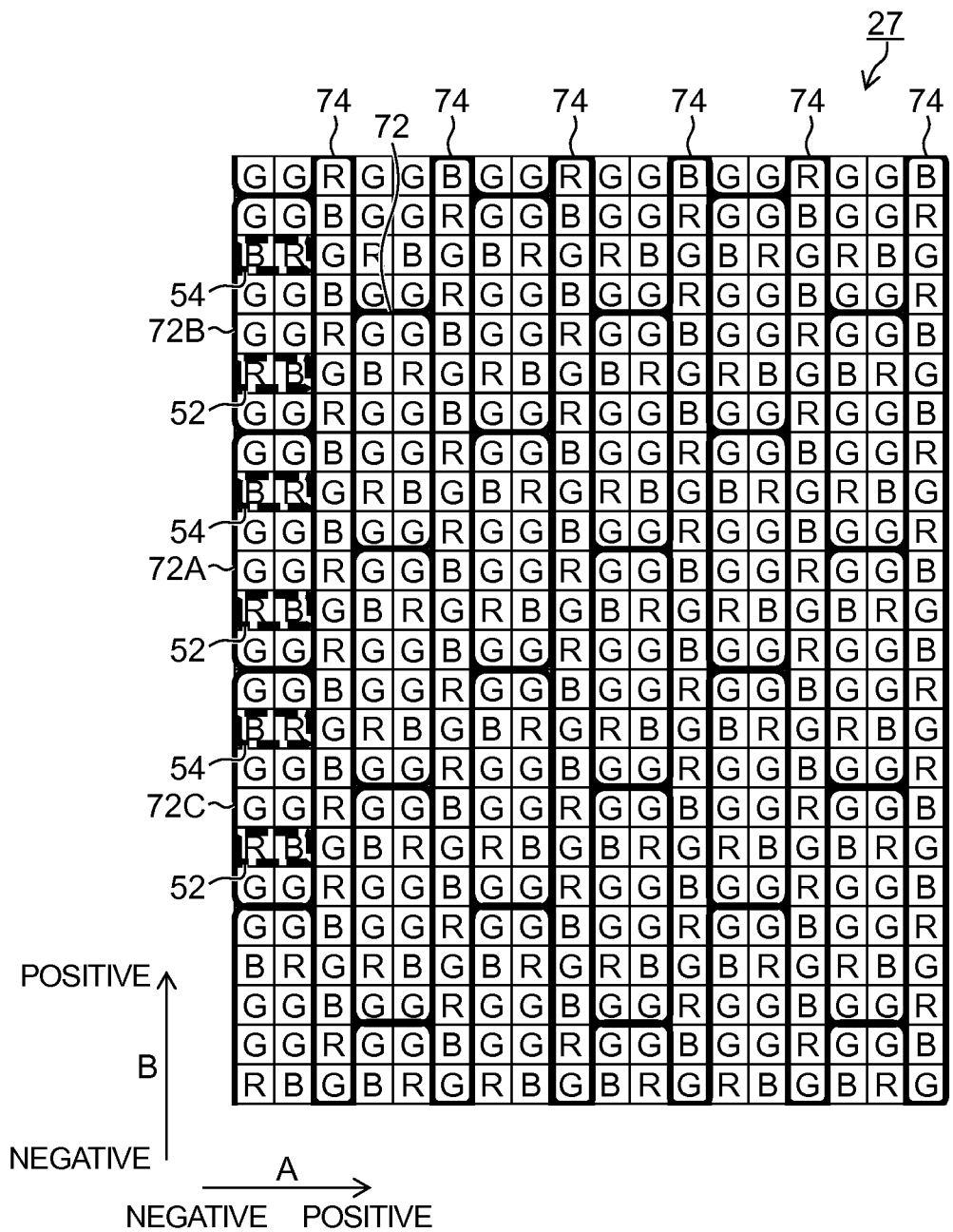
FIG. 11 is an illustration showing a pixel arrangement in a color image pickup device according to a fourth embodiment.

FIG. 11 is an illustration showing a pixel arrangement in the color image pickup device 27 according to a fourth embodiment.

The components the same as or similar to those in the first embodiment, second embodiment, third embodiment and modification examples described above are designated by the same reference numerals or signs, and their detailed description is omitted.

The arrangement of the plural pixels constituting the color image pickup device 27 in this embodiment is the same as those in the first embodiment and the second embodiment.

Also, this embodiment is the same as the second embodiment in that each of the plural pixels is classified into any of the plural pixel blocks 72 and plural buffer blocks 74, and in the method for detecting whether or not the red anomalous oblique incident light 58 is incident and for detecting the incident direction by the anomalous oblique incident light detection unit 68.

However, the anomalous oblique incident light correction unit 70 in this embodiment, in calculating the correction amount for the pixel data in the pixel block 72 that is a target to be subjected to the color mixture correction, adds a color mixture correction amount calculated for an adjacent surrounding pixel block 72.

In the example shown in FIG. 11, the first pair 52 of RB pixels and the second pair 54 of RB pixels are disposed in the vertical direction in each of the plural pixel blocks 72. The plural pixel blocks 72 include the pixel blocks 72 adjacent to each other in the vertical direction B that is an arrangement direction of the first pair 52 of RB pixels and the second pair 54 of RB pixels included in each of the plural pixel blocks 72.

For example, the pixel block 72A shown in FIG. 11 is adjacent to the pixel block 72B and the pixel block 72C in the positive direction and negative direction of the vertical direction B, respectively.

The anomalous oblique incident light correction unit 70 corrects the pixel data of a pixel having the photodiode 64 in the pixel block 72 on which the red anomalous oblique incident light 58 is incident, the relevant pixel block 72 including the first pair 52 of RB pixels and the second pair 54 of RB pixels on which the red anomalous oblique incident light 58 is incident, which has been detected by the anomalous oblique incident light detection unit 68, the correction being on the basis of the pixel data of the B pixel of the first pair 52 of RB pixels and the pixel data of the B pixel of the second pair 54 of RB pixels in the relevant pixel block 72, and the pixel data of the B pixel of the first pair 52 of RB pixels and the pixel data of the B pixel of the second pair 54 of RB pixels in a pixel block 72 adjacent to the relevant pixel block 72.

For example, in a case where the incidence of the red anomalous oblique incident light 58 on this pixel block 72A in the horizontal direction A is detected from the pixel data of the B pixels of the first pair 52 of RB pixels and second pair 54 of RB pixels in the pixel block 72A shown in FIG. 11, the anomalous oblique incident light detection unit 68 calculates "a difference value DA between the pixel data of the B pixels of the first pair 52 of RB pixels and second pair 54 of RB pixels in the pixel block 72A", "a difference value DB between the pixel data of the B pixels of the first pair 52 of RB pixels and second pair 54 of RB pixels in the pixel block 72B", and "a difference value Dc between the pixel data of the B pixels of the first pair 52 of RB pixels and second pair 54 of RB pixels in the pixel block 72C".

Then, a color mixture correction amount $D_m$ for pixel data in the pixel block 72A is found from the above calculated difference values $D_A$, $D_B$, and $D_C$. The color mixture correction amount $D_m$ may be calculated by any method, and an average value of the above difference values $D_A$, $D_B$, and $D_C$, ($D_m = (D_A + D_B + D_C)/3$) or a value calculated by moving average processing may be applied to the color mixture correction amount $D_m$. For example, in a case where, of the moving average processing, the "121 filter" by way of weighted moving average arithmetic is applied to the above difference values $D_A$, $D_B$, and $D_C$, a weight for the difference value $D_A$ between the pixel data of the B pixels in the pixel block 72A that is a target to be corrected is made twice with respect to weights for the difference values $D_B$ and $D_C$ between the pixel data of the B pixels in the adjacent pixel blocks 72B and 72C, respectively, ($D_m = (2 \times D_A + D_B + D_C)/4$), finding the color mixture correction amount $D_m$ with a good accuracy.

In this way, calculating the correction amount $D_m$ of the color mixture correction in the pixel block 72A as a target to be corrected, not only by use of the difference value $D_A$ between the pixel data of the B pixels in the pixel block 72A as a target to be corrected but also with adding the difference values $D_B$ and $D_C$ between the pixel data of the B pixels in the adjacent pixel blocks 72B and 72C, respectively, makes it possible to effectively prevent deterioration of the pixel data of the B pixels in the pixel block 72A as a target to be corrected. In other words, the color mixture correction amount $D_m$ for the pixel block 72A is calculated by adding the difference values $D_B$ and $D_C$ between the pixel data of the B pixels in the adjacent pixel blocks 72B and 72C, respectively, as in this embodiment, effectively suppressing a loss of a feeling of resolution caused by the color mixture correction.

The anomalous oblique incident light correction unit 70 performs the color mixture correction in the pixel block 72A by subtracting the color mixture correction amount $D_m$ described above from the pixel data of the pixel which has a larger pixel data value of the pixels adjacent to the R pixel in the horizontal direction A in which the red anomalous oblique incident light 58 is incident (the B pixels of the first pair 52 of RB pixels and the second pair 54 of RB pixels in the example shown in FIG. 11).

The above description explains the processing in the detection and color mixture correction of the red anomalous oblique incident light 58 in the horizontal direction A, but the detection and color mixture correction of the red anomalous oblique incident light 58 in the vertical direction B can also be performed as in the detection and color mixture correction of the red anomalous oblique incident light 58 in the horizontal direction A.

As described above, according to this embodiment, the correction amount of the color mixture correction in the pixel block 72 as a target to be corrected is calculated with taking into account the pixel data of the B pixels in the adjacent pixel blocks 72, allowing the color mixture correction to be performed with further preventing deterioration of a feeling of resolution.

Hereinabove, the preferred embodiments of the present invention are described, but the invention is not limited to the above described embodiments and can be adequately applied to other embodiments.

Figure 12:
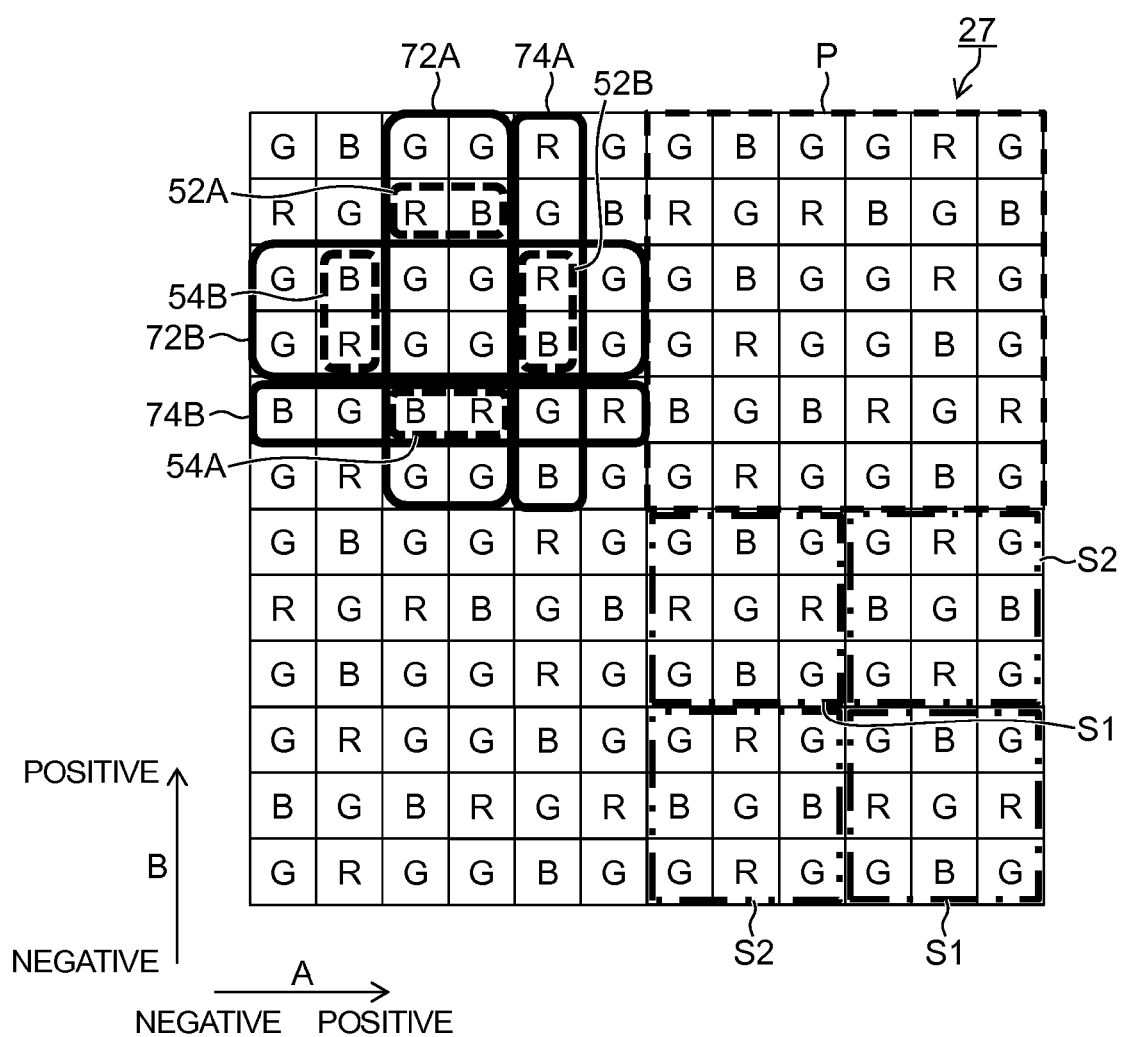
FIG. 12 is an illustration showing an example of another pixel arrangement (color filter arrangement) to which the invention is applicable.

The pixel arrangement in the color image pickup device 27 is not specifically limited, and, for example, the above technology can also be applied to the color image pickup device 27 having a pixel arrangement shown in FIG. 12. The color image pickup device 27 in FIG. 12 has the basic arrangement pixel group P constituted by two first sub arrangements S1 and two the second sub arrangements S2 which are adjacently arranged in the horizontal direction A and the vertical direction B, the first sub arrangements S1 being constituted by "G pixel, B pixel, and G pixel", "R pixel, G pixel, and R pixel", and "G pixel, B pixel, and G pixel" that are adjacently arranged in the horizontal direction A, and the second sub arrangements S2 being constituted by "G pixel, R pixel, and G pixel", and "B pixel, G pixel, and B pixel", and "G pixel, R pixel, and G pixel" that are adjacently arranged in the horizontal direction A. In this case also, the detection and color mixture correction of the red anomalous oblique incident light 58 in the horizontal direction A can be performed as in the embodiments and modification examples described above, on the basis of the pixel block 72A and a buffer block 74A disposed between the pixel blocks 72A, the pixel block 72A including a first pair 52A of RB pixels and a second pair 54A of RB pixels in which pair the R pixel and the B pixel are arranged adjacent to each other in the horizontal direction A. Similarly, the detection and color mixture correction of the red anomalous oblique incident light 58 in the vertical direction B can be performed as is in the embodiments and modification examples described above, on the basis of the pixel block 72B and a buffer block 74B disposed between the pixel blocks 72B, the pixel block 72B including a first pair 52B of RB pixels and a second pair 54B of RB pixels in which pair the R pixel and the B pixel are arranged adjacent to each other in the vertical direction B.

Figure 13:
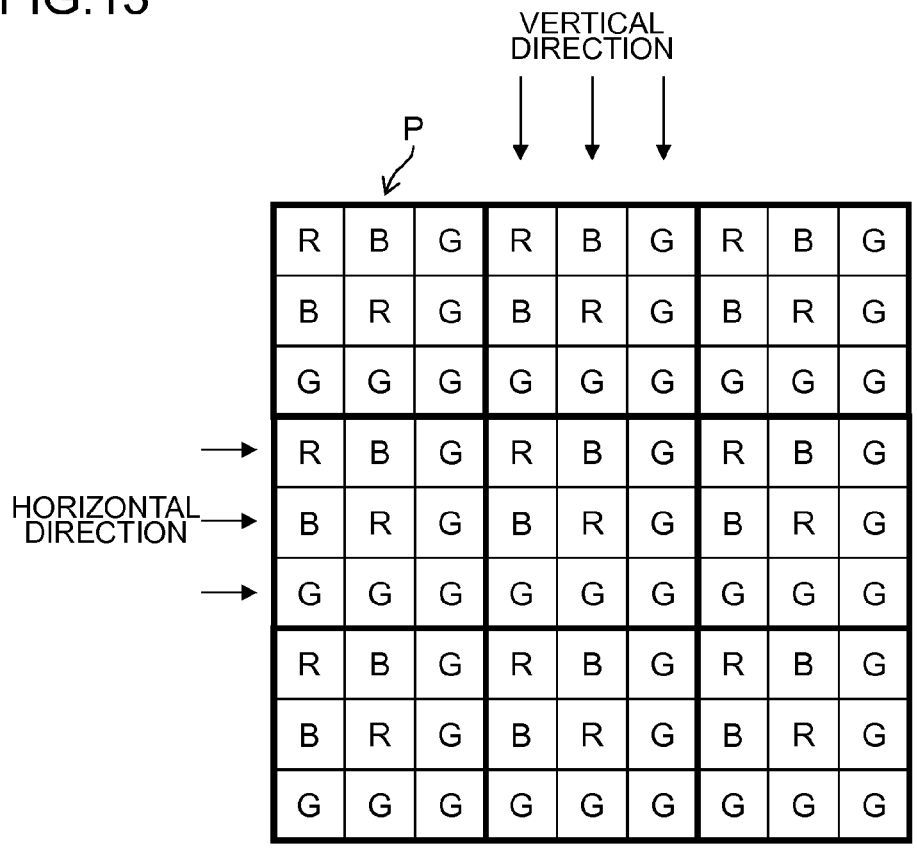
FIG. 13 is an illustration showing a modification example of the pixel arrangement in the color image pickup device.

Further, the pixel arrangement in the color image pickup device 27 is not specifically limited. For example, the pixel arrangement in the color image pickup device 27 includes those which have as a basic arrangement pattern an arrangement group of N pixels×M pixels (N is an integer equal to or more than 3, and M is an integer equal to or more than 3) in the first direction (e.g., horizontal direction) and the second direction (e.g., vertical direction), and in which the basic arrangement patterns are arrayed in the first direction and the second direction. As an example, a case may be considered in which an arrangement group of 3 pixels×3 pixels as shown in FIG. 13 (arrangement group in which there are arrayed in the vertical direction a row of "R pixel, B pixel, and G pixel", a row of "B pixel, R pixel, and G pixel", and a row of "G pixel, G pixel, and G pixel", in each row the pixels being arrayed in the horizontal direction) is used as the basic arrangement pattern. Regarding a size of the basic arrangement pattern, if the number of pixels in the basic arrangement pattern increases, signal processing such as the demosaic processing is complicated. Therefore, in terms of prevention of complicated signal processing, the size of the basic arrangement pattern is preferably equal to or less than 10 pixels×10 pixels (horizontal direction×vertical direction) that is not too large, and more preferably equal to or less than 8 pixels×8 pixels (horizontal direction×vertical direction).

The above described embodiment describes the examples in which the plural pixels are arranged in the horizontal direction and the vertical direction, but an arrangement direction of the plural pixels may be sufficient so long as it is based on two directions perpendicular to each other, and, for example, a "honeycomb arrangement" may be used in which the plural pixels are arranged to be rotated by 45 degrees with respect to the horizontal direction and the vertical direction.

The above embodiment describes the digital camera 10, but the configuration of the image capture device is not limited to thereto. Examples of other image capture devices to which the present invention can be applied include, for example, a built-in or external camera for PC, or a portable terminal device having the imaging function as described below. Additionally, the present invention may also be applied to a program (software) causing a computer to execute the processing steps described above.

Examples of the portable terminal device as an embodiment of the image capture device according to the invention include, for example, a mobile phone, smartphone, PDA (Personal Digital Assistants), portable game console. Hereinafter, a description is given in detail using the smartphone as an example with reference to the drawings.

Configuration of Smartphone

Figure 14:
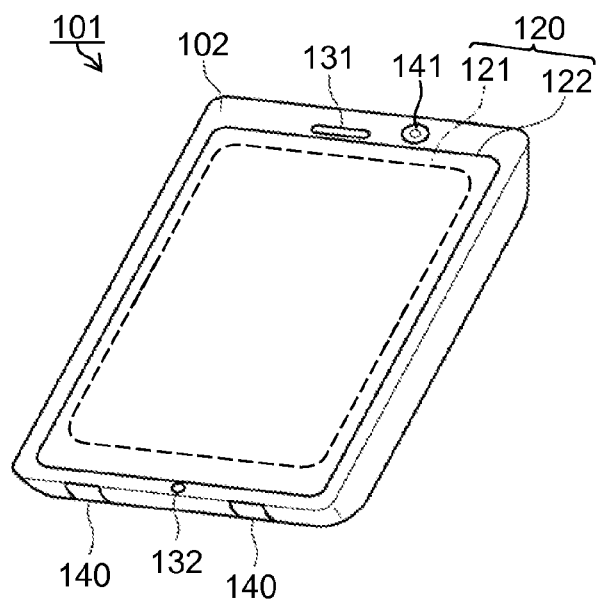
FIG. 14 is an illustration showing an outer appearance of a smartphone that is an embodiment of the image capture device according to the invention.

FIG. 14 shows an outer appearance of a smartphone 101 as an embodiment of the image capture device according to the invention. The smartphone 101 shown in FIG. 14 having a housing 102 shaped in a flat plate includes on one face of the housing 102 a display and input unit 120 in which a display panel 121 and an operation panel 122 as an input unit are integrated. Such a housing 102 includes a speaker 131, microphone 132, operation unit 140, and camera unit 141. A configuration of the housing 102 is not limited thereto, and a configuration in which the display unit and the input unit are independent of each other, and a configuration having a clamshell structure or a slide mechanism may be used, for example.

Figure 15:
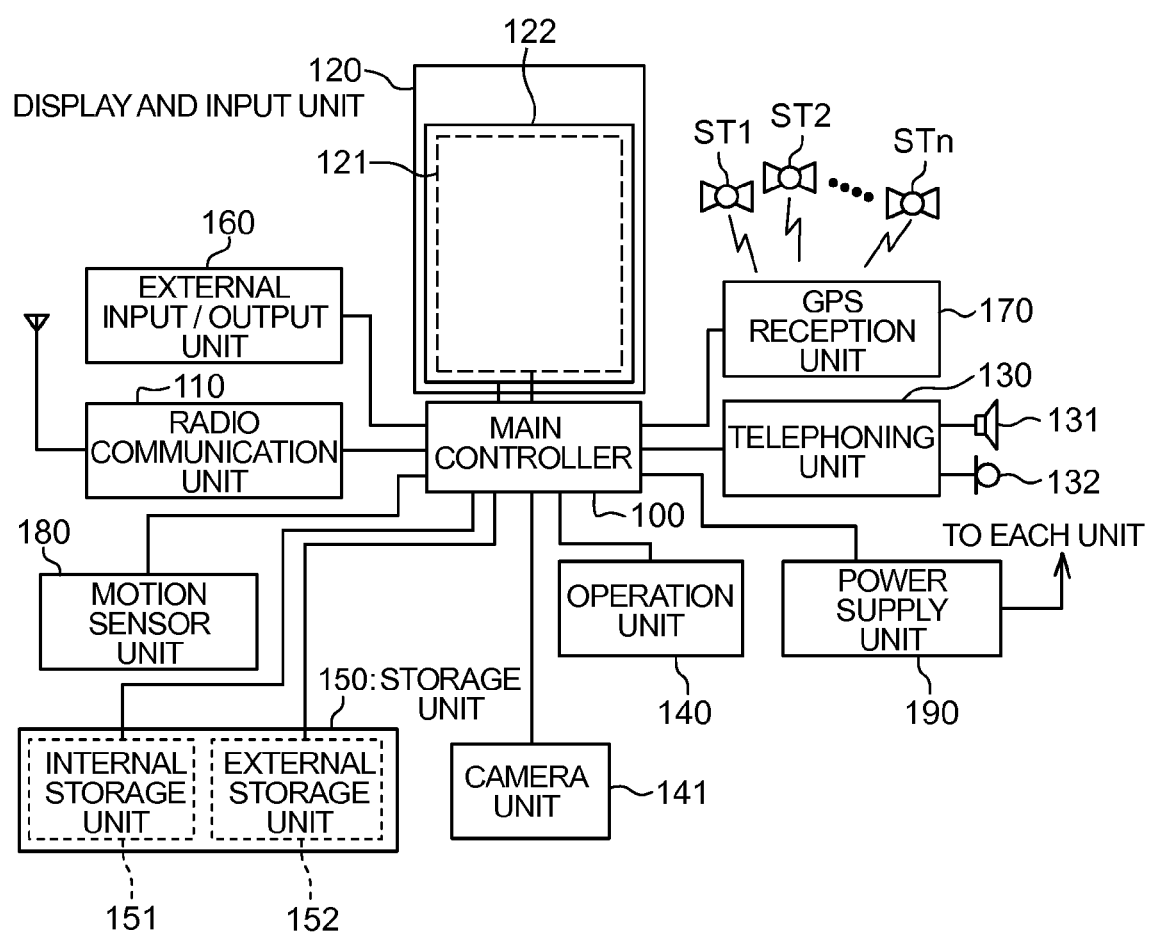
FIG. 15 is a block diagram showing a configuration of the smartphone shown in FIG. 12.

FIG. 15 is a block diagram showing the configuration of the smartphone 101 shown in FIG. 14. As shown in FIG. 15, included are as main components of the smartphone a radio communication unit 110, display and input unit 120, telephoning unit 130, operation unit 140, camera unit 141, storage unit 150, external input/output unit 160, GPS (Global Positioning System) reception unit 170, motion sensor unit 180, power supply unit 190, and main controller 100. The smartphone 101 has, as a main function, a radio communication function for carrying out mobile radio communication with a base station device BS via a mobile communication network NW.

The radio communication unit 110 carries out radio communication with the base station device BS included in the mobile communication network NW according to an instruction from the main controller 100. Such radio communication is used to transmit and receive various pieces of file data such as audio data, image data and the like, and e-mail data and the like and receive Web data, streaming data and the like.

The display and input unit 120 is a so-called touch panel which, by way of control by the main controller 100, displays and visually delivers to the user an image (still image and moving image) and text information, and detects a user's operation on the displayed information, and includes the display panel 121 and the operation panel 122.

The display panel 121 uses a LCD (Liquid Crystal Display), an OELD (Organic Electro-Luminescence Display) and the like as a display device. The operation panel 122, which is placed such that an image displayed on a display surface of the display panel 121 can be visually recognized, is a device for detecting one or more coordinates operated by a user's finger or a stylus. If the device like this is operated by a user's finger or a stylus, a detection signal generated due to the operation is output to the main controller 100. Subsequently, the main controller 100 detects an operated position (coordinates) on the display panel 121 on the basis of the received detection signal.

As shown in FIG. 14, the display panel 121 and operation panel 122 in the smartphone 101 which is illustrated as an embodiment of the image capture device according to the present invention are integrated to constitute the display and input unit 120, and the operation panel 122 is arranged in a manner to fully cover the display panel 121. In a case of using such an arrangement, the operation panel 122 may have a function to detect the user's operation on also an area outside the display panel 121. In other words, the operation panel 122 may have a detection area for an overlapping portion overlapped with the display panel 121 (hereinafter, referred to as a displayed area) and a detection area for a peripheral portion not overlapped with the display panel 121 other than the overlapping portion (hereinafter, referred to as a non-displayed area).

Note that a size of the displayed area and a size of the display panel 121 may completely match each other, but both sizes may not necessarily match. The operation panel 122 may have two sensitive areas of the peripheral portion and an inside portion other than that. Further, a width of the peripheral portion is appropriately designed depending on a size of the housing 102 and the like. A position detection method used for the operation panel 122 includes a matrix switch method, resistance film method, surface acoustic wave method, infrared ray method, electromagnetic induction method, electrostatic capacitance method and the like, any method of which may be used.

The telephoning unit 130 having the speaker 131 and the microphone 132 converts user voice input through the microphone 132 into the audio data processable by the main controller 100 to output to the main controller 100, and decodes the audio data received by the radio communication unit 110 or the external input/output unit 160 to output from the speaker 131. As shown in FIG. 14, for example, the speaker 131 may be mounted on a face the same as a face provided with the display and input unit 120, and the microphone 132 may be mounted on a lateral face of the housing 102.

The operation unit 140 which is a hardware key using a key switch and the like accepts an instruction from the user. For example, as shown in FIG. 14, the operation unit 140 is mounted on a lateral face of the housing 102 of the smartphone 101, and is a press-button type switch which is turned on when pressed down by a finger or the like and is brought into a turned-off state by a restoring force of a spring or the like when the finger is released.

The storage unit 150 stores a control program and control data for the main controller 100, application software, address data having a name, telephone number and the like of the communication other end associated with each other, data of transmitted and received e-mail, Web data downloaded by way of Web browsing, and downloaded content data, and transiently stores streaming data or the like. The storage unit 150 includes an internal storage unit 151 built in the smartphone and an external storage unit 152 having a detachable external memory slot. Each of the internal storage unit 151 and the external storage unit 152 included in the storage unit 150 is achieved by use of a storage medium such as a flash memory type, hard disk type, multimedia card micro type, card type memory (e.g., Micro SD (trademark) memory or the like), RAM (Random Access Memory), and ROM (Read Only Memory).

The external input/output unit 160 serves as an interface with all external devices coupled to the smartphone 101 to allow other external devices to be directly or indirectly connected via a communication or the like (e.g., USB (Universal Serial Bus), IEEE1394, etc.) or network (e.g., Internet, wireless LAN, Bluetooth (trademark), RFID (Radio Frequency Identification), IrDA (Infrared Data Association) (trademark), UWB (Ultra Wideband) (trademark), ZigBee (trademark), etc.).

Examples of the external device coupled to the smartphone 101 include, for example, a wired/wireless head set, wired/wireless external charger, wired/wireless data port, memory card or SIM (Subscriber Identity Module Card)/UIM (User Identity Module Card) card connected via a card socket, external audio and video device connected via an audio and video I/O (Input/Output) terminal, external audio and video device wirelessly connected, smartphone via a wired/wireless connection, personal computer via a wired/wireless connection, PDA via a wired/wireless connection, personal computer via a wired/wireless connection, earphone, and the like. The external input/output unit can deliver data received by way of transmission from the external device above to the respective components in the smartphone 101 and transmit the data in the smartphone 101 to the external devices.

The GPS reception unit 170 receives GPS signals transmitted from GPS satellites ST1 to STn to perform positioning arithmetic processing on the basis of the received plural GPS signals according to an instruction from the main controller 100, and detects a position including latitude, longitude, and altitude of the smartphone 101. When positional information can be acquired from the radio communication unit 110 or the external input/output unit 160 (e.g., wireless LAN), the GPS reception unit 170 may use the positional information to detect the position.

The motion sensor unit 180 which includes, for example, a triaxial acceleration sensor or the like detects physical motion of the smartphone 101 according to an instruction from the main controller 100. Detection of the physical motion of the smartphone 101 allows a direction or acceleration of motion of the smartphone 101 to be detected. Such a detection result is to be output to the main controller 100.

The power supply unit 190 supplies electrical power stored in a battery (not shown) to each part of the smartphone 101 according to an instruction from the main controller 100.

The main controller 100 which includes a microprocessor operates according to the control program or control data stored in the storage unit 150 and collectively controls the respective parts of the smartphone 101. The main controller 100 has a mobile communication controlling function to control each part in a communication system and an application processing function for performing audio communication or data communication via the radio communication unit 110.

The application processing function is attained by the main controller 100 operating according to the application software stored by the storage unit 150. Examples of the application processing function include, for example, an IrDA function to control the external input/output unit 160 to perform the data communication with an opposite device, e-mail function to transmit and receive an e-mail, Web browsing function to view a Web page, and the like.

The main controller 100 has an image processing function to display a video on the display and input unit 120 on the basis of the image data such as the received data or the downloaded streaming data (data of still image and moving image). The image processing function refers to a function that the main controller 100 decodes the above image data and subjects such a decoding result to the image processing to display the image on the display and input unit 120.

Further, the main controller 100 executes display control of the display panel 121 and operation detecting control to detect the user's operation via the operation unit 140 and the operation panel 122.

The main controller 100 executes the display control to display an icon for starting the application software or a software key such as a scroll bar, or display a window for creating an e-mail. Note the scroll bar refers to a software key for accepting an instruction to move a displayed portion of an image such as a large image not entirely accommodated within a displayed area of the display panel 121.

The main controller 100 executes the operation detecting control to detect the user's operation input via the operation unit 140, accepts via the operation panel 122 an operation on the above icon or input of a character string to an input field in the above window, or accepts a request input via the scroll bar for scrolling of the displayed image.

Further, the main controller 100 has a touch panel controlling function to execute the operation detecting control to determine whether an operated position on the operation panel 122 is the overlapping portion (displayed area) overlapped with the display panel 121 or the peripheral portion (non-displayed area) not overlapped with the display panel 121 other than the overlapping portion, and control the sensitive area of the operation panel 122 or a displayed position of the software key.

The main controller 100 can also detect a gesture operation on the operation panel 122 and execute a predetermined function depending on the detected gesture operation. The gesture operation means not a simple touch operation of related art, but an operation including tracking by a finger or the like, simultaneously specifying a plurality of positions, or combining these operations to track from at least one of a plurality of positions.

The camera unit 141 is a digital camera electronically imaging by use of the image pickup device such as a CMOS (Complementary Metal Oxide Semiconductor) or a CCD (Charge-Coupled Device). The camera unit 141 can under the control of the main controller 100 convert the image data obtained by image-capturing into a compressed image data such as JPEG (Joint Photographic coding Experts Group), for example, to store in the storage unit 150 and output via the external input/output unit 160 or the radio communication unit 110. In the smartphone 101 shown in FIG. 14, the camera unit 141 is mounted on the same face as the display and input unit 120, but, a mounted position of the camera unit 141 being not limited thereto, may be mounted on a rear face of the display and input unit 120, or a plurality of camera units 141 may be mounted. In the case where a plurality of camera units 141 are mounted, the camera unit 141 for imaging may be changed over for singularly imaging or a plurality of camera units 141 may be simultaneously used for imaging.

The camera unit 141 can be used for the various functions of the smartphone 101. For example, an image obtained by the camera unit 141 may be displayed on the display panel 121, or an image by the camera unit 141 may be used as one of operation input on the operation panel 122. When the GPS reception unit 170 detects a position, the position can be detected by referring an image from the camera unit 141. Further, by referring an image from the camera unit 141, without using the triaxial acceleration sensor or in combination with the triaxial acceleration sensor, an optical axis direction of the camera unit 141 of the smartphone 101 can be determined, and also a current usage environment can be determined. Of course, an image from the camera unit 141 may be used in the application software.

Besides, the image data of a still image or moving image may be added with the positional information obtained by the GPS reception unit 170, voice information obtained by the microphone 132 (which may be voice-text converted by the main controller or the like into text information), attitude information obtained by the motion sensor unit 180 and the like to be stored in the storage unit 150 and be output via the external input/output unit 160 or the radio communication unit 110.

In the smartphone 101 described above, the image processing circuit 32 in FIG. 1 can be appropriately achieved by using, for example, the main controller 100, storage unit 150 and the like.

What is claimed is:
1. An image capture device comprising:
   an image pickup device having plural pixels arranged in a first direction and a second direction perpendicular to the first direction, each of the plural pixels including a color filter and a photodiode receiving a light having passed through the color filter to output pixel data; and
   an anomalous oblique incident light detection device that detects whether or not an anomalous oblique incident light is incident on the image pickup device on the basis of the pixel data,
   wherein
   the plural pixels include a first pixel pair and a second pixel pair which are each constituted by a first-color pixel having a first-color color filter and a second-color pixel having a second-color color filter, the first-color pixel and the second-color pixel being adjacent to each other in at least one of the first direction and the second direction, and have an arrangement in which a position of the first-color pixel and a position of the second-color pixel are opposite to each other,
   the first-color color filter has a light transmission rate higher than the second-color color filter in at least a part of a red light wavelength range, and
   the anomalous oblique incident light detection device compares the pixel data of the second-color pixel of the first pixel pair with the pixel data of the second-color pixel of the second pixel pair to detect whether or not the anomalous oblique incident light is incident.
2. The image capture device according to claim 1, wherein the first-color color filter has a light transmission rate equal to or more than 50% in a wavelength range of 600 nm to 650 nm, and the second-color color filter has a light transmission rate less than 50% in a wavelength range of 600 nm to 650 nm.
3. The image capture device according to claim 1, wherein the first-color color filter is any of a red filter, a transparent filter, and a white filter, and
the second-color color filter is any of a blue filter and a green filter.
4. The image capture device according to claim 1, wherein the anomalous oblique incident light detection device detects whether or not the anomalous oblique incident light is incident, on the basis of whether or not a difference value between the pixel data of the second-color pixel of the first pixel pair and the pixel data of the second-color pixel of the second pixel pair is equal to or more than a threshold.
5. The image capture device according to claim 1, wherein the anomalous oblique incident light detection device determines an incident direction of the anomalous oblique incident light on the basis of a magnitude relationship between the pixel data of the second-color pixel of the first pixel pair and the pixel data of the second-color pixel of the second pixel pair.
6. The image capture device according to claim 5, further comprising:
   a correction device that corrects the pixel data of the pixel having the photodiode on which the anomalous oblique incident light is incident on the basis of a detection result by the anomalous oblique incident light detection device,
   wherein the correction device determines the pixel, of the plural pixels, having the photodiode on which the anomalous oblique incident light is incident, on the basis of the incident direction of the anomalous oblique incident light determined by the anomalous oblique incident light detection device.
7. The image capture device according to claim 6, wherein the correction device corrects the pixel data of the pixel having the photodiode on which the anomalous oblique incident light is incident on the basis of the difference value between the pixel data of the second-color pixel of the first pixel pair and the pixel data of the second-color pixel of the second pixel pair.
8. The image capture device according to claim 6, wherein the correction device corrects the pixel data of the pixel having the photodiode on which the anomalous oblique incident light is incident, on the basis of the pixel data of a pixel which has a color filter of the same color as the pixel having the photodiode on which the anomalous oblique incident light is incident, and which has the photodiode on which no anomalous oblique incident light is incident.
9. The image capture device according to claim 6, wherein the plural pixels include plural pixel blocks, each of the plural pixel blocks including pixels constituting the first pixel pair and the second pixel pair and pixels adjacent to the pixels constituting the first pixel pair and the second pixel pair,
at least a part of the plural pixels is classified into any of the plural pixel blocks, and
the correction device corrects the pixel data of the pixel having the photodiode on which the anomalous oblique incident light is incident, on the basis of the pixel data of the second-color pixel of the first pixel pair and the pixel data of the second-color pixel of the second pixel pair, in the pixel block including the first pixel pair and the second pixel pair where it is detected by the anomalous oblique incident light detection device that the anomalous oblique incident light is incident.

10. The image capture device according to claim 9, wherein
the plural pixels include the plural pixel blocks and plural buffer blocks disposed between the plural pixel blocks,
each of the plural pixels is classified into any of the plural pixel blocks and the plural buffer blocks, and
the correction device corrects the pixel data of the pixel, of the pixels included in the buffer block, having the photodiode on which the anomalous oblique incident light is incident, on the basis of a correction amount for the pixel data of the pixel having the photodiode on which the anomalous oblique incident light is incident, of the pixel blocks adjacent to the relevant buffer block.

11. The image capture device according to claim 1, wherein
the plural pixels include a first pixel pair block and a second pixel pair block, in each of which pair blocks the first pixel pair and the second pixel pair are adjacently arranged with 2 pixels being arranged in the first direction and 2 pixels being arranged in the second direction,
a position of the first-color pixel and a position of the second-color pixel are opposite to each other between the first pixel pair block and the second pixel pair block, and
the anomalous oblique incident light detection device determines the incident direction of the anomalous oblique incident light on the basis of the pixel data of two pixels included in the first pixel pair block and having the second-color color filter and the pixel data of two pixels included in the second pixel pair block and having the second-color color filter.

12. The image capture device according to claim 11, wherein
the first pixel pair block includes a first pixel to which the first-color pixels are adjacent on one side in the first direction and on one side in the second direction and which has the second-color color filter, and a second pixel to which the first-color pixels are adjacent on the other side in the first direction and on the other side in the second direction and which has the second-color color filter,
the second pixel pair block includes a third pixel to which the first-color pixels are adjacent on the other side in the first direction and on one side in the second direction and which has the second-color color filter, and a fourth pixel to which the first-color pixels are adjacent on one side in the first direction and on the other side in the second direction and which has the second-color color filter, and
the anomalous oblique incident light detection device determines the incident direction of the anomalous oblique incident light on the basis of a magnitude relationship between the pixel data of the first pixel and the pixel data of the second pixel and a magnitude relationship between the pixel data of the third pixel and the pixel data of the fourth pixel.

13. The image capture device according to claim 9, wherein
the first pixel pair and the second pixel pair are disposed in the first direction or the second direction in each of the plural pixel blocks,
the plural pixel blocks include the pixel blocks adjacent to each other in a direction, of the first direction and the second direction, in which the first pixel pair and the second pixel pair included in the plural pixel blocks are disposed, and the correction device corrects the pixel data of the pixel having the photodiode on which the anomalous oblique incident light is incident in the pixel block including the first pixel pair and the second pixel pair where it is detected by the anomalous oblique incident light detection device that the anomalous oblique incident light is incident, on the basis of the pixel data of the second-color pixel of the first pixel pair and the pixel data of the second-color pixel of the second pixel pair in the relevant pixel block, and the pixel data of the second-color pixel of the first pixel pair and the pixel data of the second-color pixel of the second pixel pair in the pixel block adjacent to the relevant pixel block.

14. The image capture device according to claim 1, wherein
the plural pixels include plural basic arrangement pixel groups arrayed in the first direction and the second direction, each group having a color filter arrangement pattern, and
each of the plural basic arrangement pixel groups includes the first pixel pair and the second pixel pair.

15. An anomalous oblique incident light detection method for detecting whether or not an anomalous oblique incident light is incident on an image pickup device, on the basis of pixel data output from the image pickup device, the image pickup device having plural pixels arranged in a first direction and a second direction perpendicular to the first direction, each of the plural pixels including a color filter and a photodiode receiving a light having passed through the color filter to output the pixel data, the plural pixels including a first pixel pair and a second pixel pair which are each constituted by a first-color pixel having a first-color color filter and a second-color pixel having a second-color color filter, the first-color pixel and the second-color pixel being adjacent to each other in at least one of the first direction and the second direction, and have an arrangement in which a position of the first-color pixel and a position of the second-color pixel are opposite to each other, and the first-color color filter having a light transmission rate higher than the second-color color filter in at least a part of a red light wavelength range,
the method comprising:
a step of acquiring the pixel data of the second-color pixel of the first pixel pair and the pixel data of the second-color pixel of the second pixel pair; and
a step of comparing the acquired pixel data of the second-color pixel of the first pixel pair with the acquired pixel data of the second-color pixel of the second pixel pair to detect whether or not the anomalous oblique incident light is incident.

16. A non-transitory storage medium having a computer-readable code of a program recorded therein, the program causing a computer to execute a procedure for detecting whether or not an anomalous oblique incident light is incident on an image pickup device on the basis of pixel data output from the image pickup device,
the image pickup device having plural pixels arranged in a first direction and a second direction perpendicular to the first direction, each of the plural pixels including a color filter and a photodiode receiving a light having passed through the color filter to output the pixel data, the plural pixels including a first pixel pair and a second pixel pair which are each constituted by a first-color pixel having a first-color color filter and a second-color pixel having a second-color color filter, the first-color pixel and the second-color pixel being adjacent to each other in at least one of the first direction and the second direction, and have an arrangement in which a position of the first-color pixel and a position of the second-color pixel are opposite to each other, and the first-color color filter having a light transmission rate higher than the second-color color filter in at least a part of a red light wavelength range, the procedure including a procedure of acquiring the pixel data of the second-color pixel of the first pixel pair and the pixel data of the second-color pixel of the second pixel pair, and a procedure of comparing the acquired pixel data of the second-color pixel of the first pixel pair with the acquired pixel data of the second-color pixel of the second pixel pair to detect whether or not the anomalous oblique incident light is incident.

* * * * *